(12) United States Patent
Park et al.

(10) Patent No.: US 12,727,513 B2
(45) Date of Patent: Sep. 1, 2026

(54) DISPLAY DEVICE

(71) Applicant: Samsung Display Co., LTD., Yongin-si (KR)

(72) Inventors: Do Yeong Park, Yongin-si (KR); Dong Hee Shin, Yongin-si (KR); Kyung Bae Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 353 days.

(21) Appl. No.: 18/365,692

(22) Filed: Aug. 4, 2023

(65) Prior Publication Data

US 2024/0072016 A1 Feb. 29, 2024

(30) Foreign Application Priority Data

Aug. 30, 2022 (KR) ........................ 10-2022-0109462

(51) Int. Cl.

| | |
|---|---|
| ***H10W 90/00*** | (2026.01) |
| ***H10H 20/851*** | (2025.01) |
| ***H10H 20/857*** | (2025.01) |

(52) U.S. Cl.

CPC .......... *H10W 90/00* (2026.01); *H10H 20/851* (2025.01); *H10H 20/857* (2025.01)

(58) Field of Classification Search

CPC . H01L 25/0753; H01L 25/167; H10H 20/851; H10H 20/857

See application file for complete search history.

(56) References Cited

U.S. PATENT DOCUMENTS

| | | | | |
|---|---|---|---|---|
| 2006/0158111 | A1 | 7/2006 | Hayashi | |
| 2020/0212140 | A1* | 7/2020 | Huh | H10H 20/854 |
| 2021/0202907 | A1* | 7/2021 | Lee | H10K 59/18 |
| 2021/0313498 | A1* | 10/2021 | Kim | H10H 20/857 |
| 2022/0059611 | A1* | 2/2022 | Oh | G09G 3/3426 |

(Continued)

FOREIGN PATENT DOCUMENTS

| | | | |
|---|---|---|---|
| JP | 2007-242997 | A | 9/2007 |
| KR | 10-2021-0072451 | A | 6/2021 |
| KR | 10-2022-0053766 | A | 5/2022 |

OTHER PUBLICATIONS

Extended European Search Report; Application No. 23194112.1, Jan. 26, 2024, 8 pps.

*Primary Examiner* — Mary Ellen Bowman

(74) *Attorney, Agent, or Firm* — Womble Bond Dickinson (US) LLP

(57) ABSTRACT

A display device includes a substrate including a display area including pixels, and a dummy area including dummy pixels, a pixel circuit layer including a transistor, and a via layer above the transistor, bank patterns above the via layer, light-emitting elements between the bank patterns in plan view, a first bank above a portion of the bank patterns, a second bank above the first bank, and including an edge bank defining an outermost boundary of the dummy area, covering an inner side of an edge bank pattern of the bank patterns overlapping the edge bank, and covering an inner side of a portion of the first bank that overlaps the edge bank, the first bank and the second bank partitioning emission areas and dummy opening areas, and a light conversion layer in the emission areas and in the dummy opening areas, which correspond to openings of the second bank.

20 Claims, 14 Drawing Sheets

(56) References Cited

U.S. PATENT DOCUMENTS

| | | | | |
|---|---|---|---|---|
| 2022/0130896 | A1 | 4/2022 | Kim | |
| 2022/0223664 | A1* | 7/2022 | Kim | H10K 59/131 |
| 2022/0320378 | A1* | 10/2022 | Hong | H01L 25/0753 |
| 2022/0406978 | A1 | 12/2022 | Song et al. | |

* cited by examiner

FIG. 5

NEA
EMA
NEA
CF3
CF2
CF1
INS5
LRL
INS4
BNK2
BNK1
INS3
INS2
INS1
BNP
VIA
PSV
ILD
GI
BFL
SUB
I'
I
CTE
ALE3
EP2
INS2
EP1
LD1
PE1
ALE2
QD/SCT
CTE
EP1
INS2
LD2
EP2
CCL
PE2
ALE1
BML
DE
ACT
T1
GE
SE
TAP
BNK2
RTAP
BNK1
INS3
INS2
CFL
DPL
PCL
DR3
DR1

FIG. 14A

DISPLAY DEVICE

CROSS-REFERENCE TO RELATED APPLICATION

The application claims priority to, and the benefit of, Korean patent application No. 10-2022-0109462 filed on Aug. 30, 2022, in the Korean Intellectual Property Office, the entire disclosure of which is incorporated herein by reference.

BACKGROUND

1. Field

The present disclosure generally relates to a display device.

2. Description of the Related Art

Recently, as interest in information displays is increased, research and development of display devices have been continuously conducted.

SUMMARY

Embodiments provide a display device including an edge bank covering an inner side of an edge bank pattern and an inner side of a portion of a first bank.

Embodiments also provide a display device having an edge bank including an outer inclined surface having a tapered face and an inner inclined surface having a reverse tapered face.

In accordance with an aspect of the present disclosure, there is provided a display device including a substrate including a display area including pixels, and a dummy area adjacent to at least one side of the display area and including dummy pixels, a pixel circuit layer including a transistor, and a via layer above the transistor, bank patterns above the via layer, light-emitting elements between the bank patterns in plan view, a first bank above a portion of the bank patterns, and extending in a first direction and in a second direction crossing the first direction, a second bank above the first bank, and including an edge bank defining an outermost boundary of the dummy area, covering an inner side of an edge bank pattern of the bank patterns that overlaps the edge bank, and covering an inner side of a portion of the first bank that overlaps the edge bank, the first bank and the second bank partitioning emission areas and dummy opening areas, and a light conversion layer in the emission areas and in the dummy opening areas, which correspond to openings of the second bank.

The second bank may be spaced apart from the edge bank in the first direction, and overlaps the first bank.

An outer inclined surface of the edge bank may be above the first bank, and has a tapered face, wherein an inner inclined surface of the edge bank has a reverse tapered face.

An end of the outer inclined surface of the edge bank may be above an end of the inner inclined surface of the edge bank.

A top surface of the edge bank may be lower than a top surface of the second bank.

An edge bank area may overlap the edge bank, includes a portion at which the via layer is removed, and covers a portion of a side of the via layer.

The display device may further include alignment electrodes above the bank patterns and extending to the via layer, and a first insulating layer between the bank patterns and the first bank, and covering the alignment electrodes.

The edge bank may contact the first insulating layer.

The first insulating layer may extend onto a passivation layer thereunder, which is exposed from the via layer.

The display device may further include a second insulating layer between the first bank and the second bank, above the light-emitting elements, and exposing sides of the light-emitting elements, and a pixel electrode above the second insulating layer, and contacting the light-emitting elements.

A first dummy opening area contacting the edge bank, among the dummy opening areas may include a passivation layer exposed at an area where part of the via layer is removed.

A width of a first dummy opening area contacting the edge bank in the first direction, among the dummy opening areas may be greater than a width of an emission area of each of the pixels in the first direction.

A width in the first direction of the first dummy opening area may be greater than a width in the first direction of a second dummy opening area among the dummy opening areas that is located inwardly of the first dummy opening area.

The light conversion layer in the first dummy opening area may include color conversion particles included in pixels of different respective colors in the display area.

In accordance with another aspect of the present disclosure, there is provided a display device including a substrate including a display area including pixels, and a dummy area adjacent to at least one side of the display area and including dummy pixels, a pixel circuit layer including a transistor, and a via layer above the transistor, bank patterns above the via layer, light-emitting elements between the bank patterns in plan view, and a bank above a portion of the bank patterns, partitioning emission areas and dummy opening areas, and including an edge bank defining an outermost boundary of the dummy area, having an outer inclined surface having a tapered face overlapping and above the bank pattern, and an inner inclined surface having a tapered face and a reverse tapered face.

The edge bank may cover an inner side of an edge bank pattern among the bank patterns that overlaps with the edge bank.

An end of the outer inclined surface of the edge bank may be higher than an end of the inner inclined surface of the edge bank.

A top surface of the edge bank may be lower than a top surface of another portion of the bank.

An edge bank area overlapping the edge bank may include a portion at which the via layer is removed, wherein the edge bank covers a portion of a side of the via layer.

The display device may further include a light conversion layer filled in the emission areas and the dummy opening areas, which correspond to openings of the bank.

BRIEF DESCRIPTION OF THE DRAWINGS

Embodiments will now be described more fully hereinafter with reference to the accompanying drawings. However, the embodiments may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 5 is a circuit diagram illustrating the pixel included in the display device shown in FIG. 3 in accordance with embodiments of the present disclosure.

FIGS. 14A and 14B are schematic sectional views illustrating a photoresist for forming a second bank is located according to the width of a dummy opening area in accordance with embodiments of the present disclosure.

DETAILED DESCRIPTION

Figure 1:
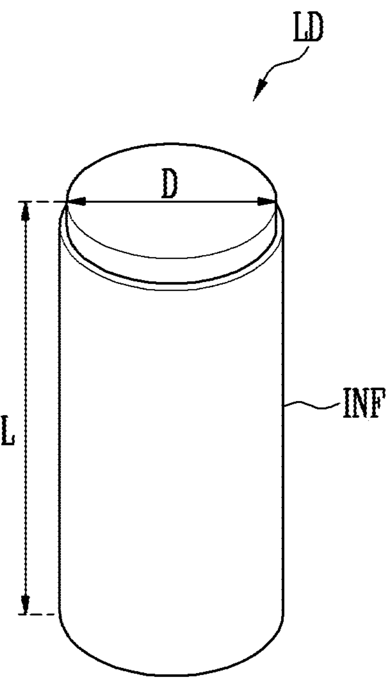
FIG. 1 is a perspective view schematically illustrating a light-emitting element in accordance with embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" and "at least one of A or B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
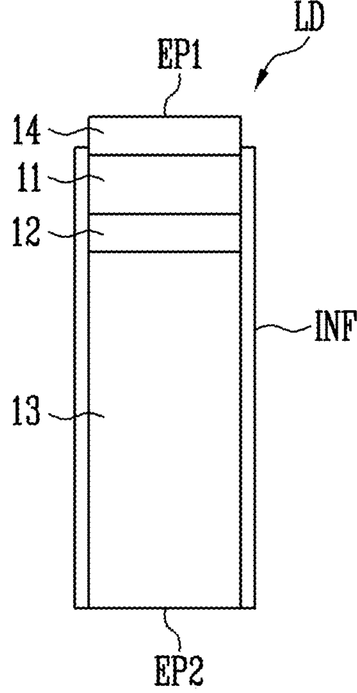
FIG. 2 is a sectional view illustrating the light-emitting element shown in FIG. 1 in accordance with embodiments of the present disclosure.

FIG. 1 is a perspective view schematically illustrating a light-emitting element in accordance with embodiments of the present disclosure. FIG. 2 is a sectional view illustrating the light-emitting element shown in FIG. 1 in accordance with embodiments of the present disclosure.

Referring to FIGS. 1 and 2, the light-emitting element LD may include a first semiconductor layer 11, an active layer 12, and a second semiconductor layer 13. In one or more embodiments, the light-emitting element LD may further include an electrode layer 14.

The light-emitting element LD may have various shapes. For example, the light-emitting element LD may have a pillar shape extending along one direction. The light-emitting element LD may have a first end portion EP1 and a second end portion EP2. One of the first and second semiconductor layers 11 and 13 may be adjacent to the first end portion EP1 of the light-emitting element LD. The other of the first and second semiconductor layers 11 and 13 may be adjacent to the second end portion EP2 of the light-emitting element LD. For example, the first semiconductor layer 11 may be adjacent to the first end portion EP1 of the light-emitting element LD, and the second semiconductor layer 13 may be adjacent to the second end portion EP2 of the light-emitting element LD.

In some embodiments, the light-emitting element LD may be a light-emitting element manufactured in a pillar shape through an etching process, etc. In this specification, the term "pillar shape" may include a rod-like shape or bar-like shape, of which an aspect ratio is greater than 1, such as a cylinder or a polyprism, and the shape of its section is not particularly limited.

The light-emitting element LD may have a relatively small size (e.g., nanometer scale to micrometer scale). In one or more embodiments, the light-emitting element LD may have a diameter D (or width) in a range of nanometer scale to micrometer scale and/or a length L in a range of nanometer scale to micrometer scale. However, the size of the light-emitting element LD is not limited thereto, and the size of the light-emitting element LD may be variously changed according to design conditions of various types of devices (e.g., a display device, and the like), which use, as a light source, a light-emitting device using the light-emitting element LD.

The first semiconductor layer 11 may be a first conductivity type semiconductor layer. For example, the first semiconductor layer 11 may include a p-type semiconductor layer.

The active layer 12 may be located between the first semiconductor layer 11 and the second semiconductor layer 13. The active layer 12 may include any one structure among a single-well structure, a multi-well structure, a single-quantum well structure, a multi-quantum well (MQW) structure, a quantum dot structure, and a quantum wire structure, but the present disclosure is not limited thereto. The active layer 12 may include GaN, InGaN, InAIGaN, AlGaN, AlN, or the like. In addition, various materials may be included in the active layer 12.

When a voltage that is a threshold voltage or more is applied to both ends of the light-emitting element LD, the light-emitting element LD may emit light as electron-hole pairs are combined in the active layer 12.

The second semiconductor layer 13 may be formed on the active layer 12, and may include a semiconductor layer having a type different from the type of the first semiconductor layer 11.

The electrode layer 14 may be located on the first end portion EP1 and/or the second end portion EP2 of the light-emitting element LD. Although a case where the electrode layer 14 is formed on the first semiconductor layer 11 is shown in FIG. 2, the present disclosure is not necessarily limited thereto. For example, a separate electrode layer may be further located on the second semiconductor layer 13. The electrode layer 14 may include a transparent metal or a transparent metal oxide.

An insulative film INF may be provided on a surface of the light-emitting element LD. The insulative film INF may be located directly on surfaces of the first semiconductor layer 11, the active layer 12, the second semiconductor layer 13, and/or the electrode layer 14. The insulative film INF may expose the first and second end portions EP1 and EP2. In some embodiments, the insulative film INF may expose a side portion of the electrode layer 14 and/or the second semiconductor layer 13, adjacent to the first and second end portions EP1 and EP2 of the light-emitting element LD.

The insulative film INF may include at least one selected from the group consisting of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$). In some embodiments, the insulative film INF may be omitted.

Figure 3:
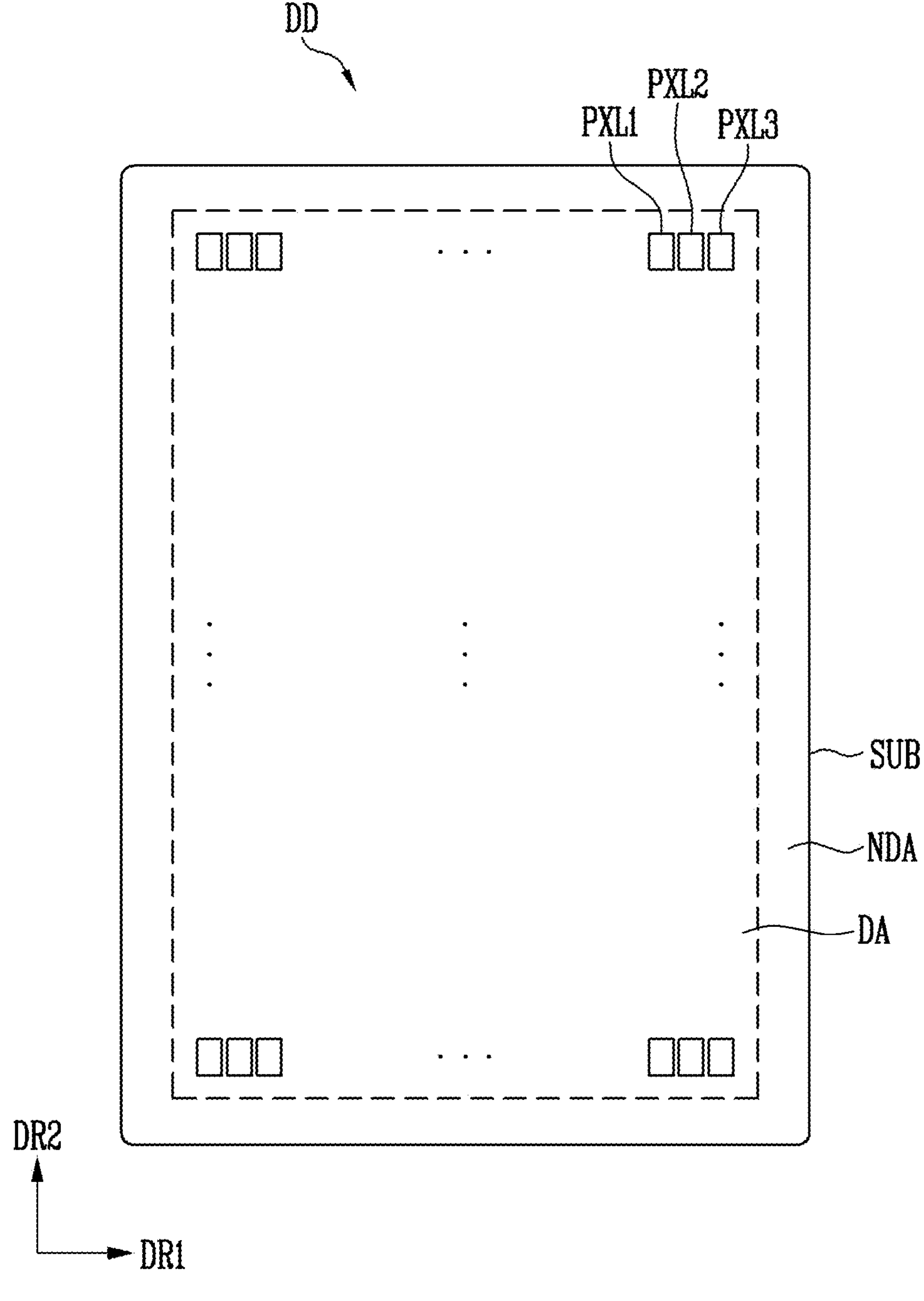
FIG. 3 is a plan view illustrating a display device in accordance with embodiments of the present disclosure.

FIG. 3 is a plan view illustrating a display device in accordance with embodiments of the present disclosure.

The present disclosure may be applied as long as the display device DD is an electronic device in which a display surface is applied to at least one surface thereof, such as a smartphone, a television, a tablet personal computer (PC), a mobile phone, a video phone, an electronic book reader, a desktop PC, a laptop PC, a netbook computer, a workstation, a server, a medical device, a camera, or a wearable device.

Referring to FIGS. 1, 2, and 3, the display device DD may include a substrate SUB, pixels PXL1, PXL2, and PXL3 that are provided on the substrate SUB and that each include at least one light-emitting element LD, a driving unit that is provided on the substrate SUB and that drives the corresponding one of the pixels PXL1, PXL2, and PXL3, and a line unit that connects the pixels PXL1, PXL2, and PXL3 to the driving unit.

The substrate SUB may include a display area DA and a non-display area NDA.

The display area DA may be an area in which the pixels PXL1, PXL2, and PXL3 for displaying an image are provided. The non-display area NDA may be an area in which the driving unit for driving the pixels PXL1, PXL2, and PXL3, and a portion of the line unit that connects the pixels PXL1, PXL2, and PXL3 to the driving unit, are provided.

The non-display area NDA may be located adjacent to the display area DA. The non-display area NDA may be provided at at least one side of the display area DA.

The line unit may electrically connect the pixels PXL1, PXL2, and PXL3 to the driving unit. The line unit may include signal lines (e.g., a scan line, a data line, and a fan-out line) connected to each of the pixels PXL1, PXL2, and PXL3 for providing signals to each of the pixels PXL1, PXL2, and PXL3.

The substrate SUB may include a transparent insulating material to enable light to be transmitted therethrough. The substrate SUB may be a rigid substrate or a flexible substrate.

Each of the pixels PXL1, PXL2, and PXL3 may be provided in the display area DA on the substrate SUB.

The pixels PXL1, PXL2, and PXL3 may include a first pixel PXL1, a second pixel PXL2, and a third pixel PXL3. In one or more embodiments, the first pixel PXL1 may be a red pixel, the second pixel PXL2 may be a green pixel, and the third pixel PXL3 may be a blue pixel. However, the present disclosure is not limited thereto, and each of the pixels PXL1, PXL2, and PXL3 may emit light of another color instead of red, green, and blue.

Each of the pixels PXL1, PXL2, and PXL3 may include a plurality of light-emitting elements LD driven by a corresponding scan signal and by a corresponding data signal. The light-emitting element LD may have a small size to a degree of a nano-scale (or nanometers) to a micro-scale (micrometers), and may be connected in parallel to light-emitting elements located adjacent thereto. However, the present disclosure is not limited thereto. The light-emitting element LD may constitute a light source of each of the pixels PXL1, PXL2, and PXL3.

Figure 4:
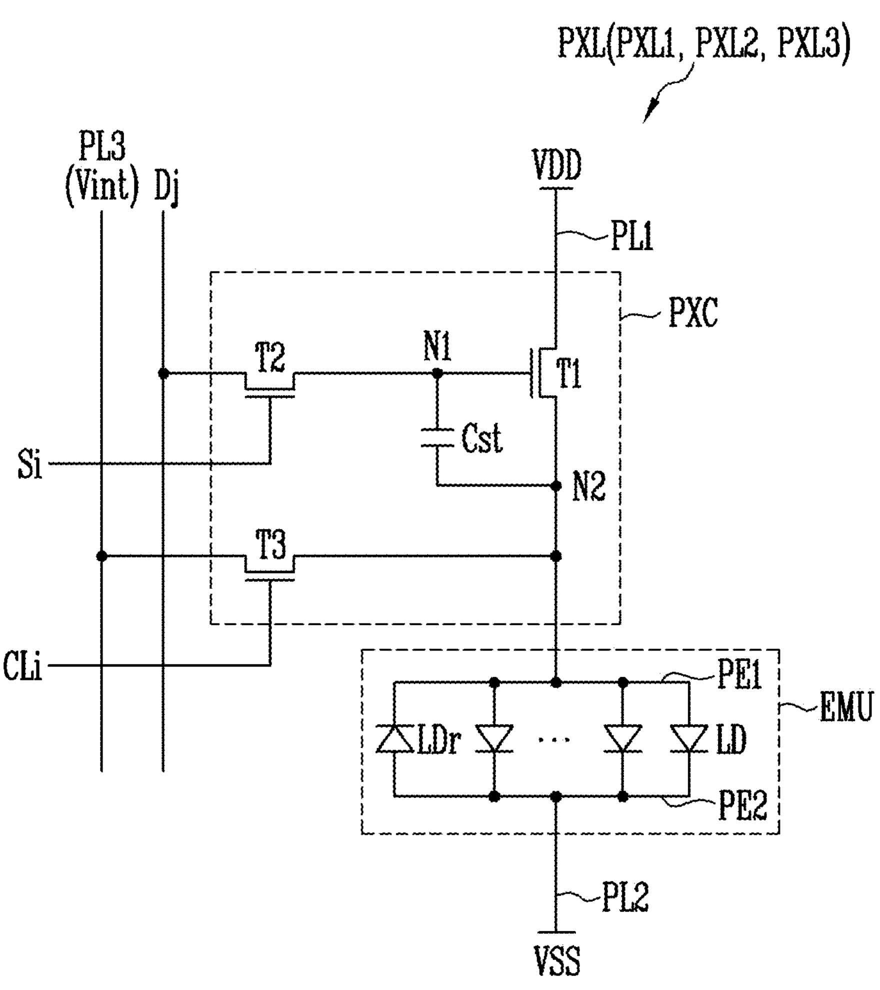
FIG. 4 is a circuit diagram illustrating a pixel included in the display device shown in FIG. 3 in accordance with embodiments of the present disclosure.

FIG. 4 is a circuit diagram illustrating the pixel included in the display device shown in FIG. 3 in accordance with embodiments of the present disclosure.

In the following, when a first pixel PXL1, a second pixel PXL2, and a third pixel PXL3 are inclusively designated, each of the first pixel PXL1, the second pixel PXL2, and the third pixel PXL3 will be referred to as a "pixel PXL."

Referring to FIGS. 1, 2, 3, and 4, the pixel PXL may include a pixel circuit PXC and a light-emitting unit EMU.

In one or more embodiments, the light-emitting unit EMU may include light-emitting elements LD connected in parallel between a first power line PL1 and a second power line PL2. Each of the light-emitting elements LD may be connected to a first pixel electrode PE1 and a second pixel electrode PE2. Each of the light-emitting elements LD connected in parallel in the same direction (e.g., a forward direction) between the first pixel electrode PE1 and the second pixel electrode PE2 may be an effective light source.

In one or more embodiments, the light-emitting unit EMU may further include at least one non-effective light source (e.g., a reverse light-emitting element LDr). The reverse light-emitting element LDr may be connected between the first and second pixel electrodes PE1 and PE2 in the opposite direction of the direction in which the light-emitting element are connected in parallel. No current substantially flows through the reverse light-emitting element LDr.

A voltage of a first power source VDD may be supplied to the first power line PL1, and a voltage of a second power source VSS may be supplied to the second power line PL2. The first power source VDD and the second power source VSS may have different potentials. In one or more embodiments, the first power source VDD may be set as a high-potential power source, and the second power source VSS may be set as a low-potential power source. A potential difference between the first and second power sources VDD and VSS may be set equal to or higher than a threshold voltage of the light-emitting elements during an emission period of the pixel PXL.

The pixel circuit PXC may be connected to a scan line Si (i is a positive integer) and to a data line Dj (j is a positive integer) of the pixel PXL. Also, the pixel circuit PXC may be further connected to a third power line PL3 and to a control line CLi. In one or more embodiments, when the pixel PXL may be located on an ith row and a jth column of the display area DA, the pixel circuit PXC of the pixel PXL may be connected to an ith scan line Si and to a jth data line Dj.

In one or more embodiments, the pixel circuit PXC may include first to third transistors T1 to T3 and a storage capacitor Cst.

The first transistor T1 may be a driving transistor for controlling a driving current applied to the light-emitting unit EMU. The first transistor T1 may be connected between the first power line PL1 and the light-emitting unit EMU (e.g., the light-emitting elements LD). A gate electrode of the first transistor T1 may be connected to a first node N1.

The first transistor T1 may control an amount of driving current applied from the first power source VDD to the light-emitting unit EMU through a second node N2 according to a voltage applied to the first node N1.

The second transistor T2 may be a switching transistor for selecting a pixel PXL in response to a scan signal. The second transistor T2 may be connected between the jth data line Dj and the first node N1. A gate electrode of the second transistor T2 may be connected to the ith scan line Si.

The second transistor T2 may be turned on by a scan signal supplied to the ith scan line Si, and may transfer a data signal to the gate electrode of the first transistor T1.

The third transistor T3 may be connected between the third power line PL3 and a second electrode of the first transistor T1 (e.g., the second node N2). A gate electrode of the third transistor T3 may be connected to an ith control line CLi. In one or more embodiments, a control signal may be supplied to the ith control line CLi at the same time as the scan signal supplied to the ith scan line Si.

The third power line PL3 may provide a voltage of a third power source Vint (e.g., an initialization power source). For example, the third power line PL3 may be commonly connected to a plurality of pixels PXL. The voltage of the third power source Vint may be different from the voltage of the first power source VDD and from the voltage of the second power source VSS.

When the third transistor T3 is turned on, the voltage of the third power source Vint may be provided to the second node N2. When a data signal is supplied to the pixel PXL, the voltage of the third power source Vint is supplied to the second node N2, so that a voltage corresponding to a difference between the data signal and the voltage of the third power source Vint may be stored in the storage capacitor Cst. Thus, the pixel PXL can be stably driven.

The storage capacitor Cst may be connected between the first node N1 and the second node N2. The storage capacitor Cst may charge a data voltage corresponding to a data signal supplied to the first node N1.

Although a case in which the first to third transistors T1, T2, and T3 are all N-type transistors is illustrated in FIG. 4, the present disclosure is not limited thereto. For example, at least one of the first to third transistors T1, T2, and/or T3 may be replaced with a P-type transistor. In addition, the structure of the pixel circuit PXC may be modified in various structures known in the art.

Figure 5:
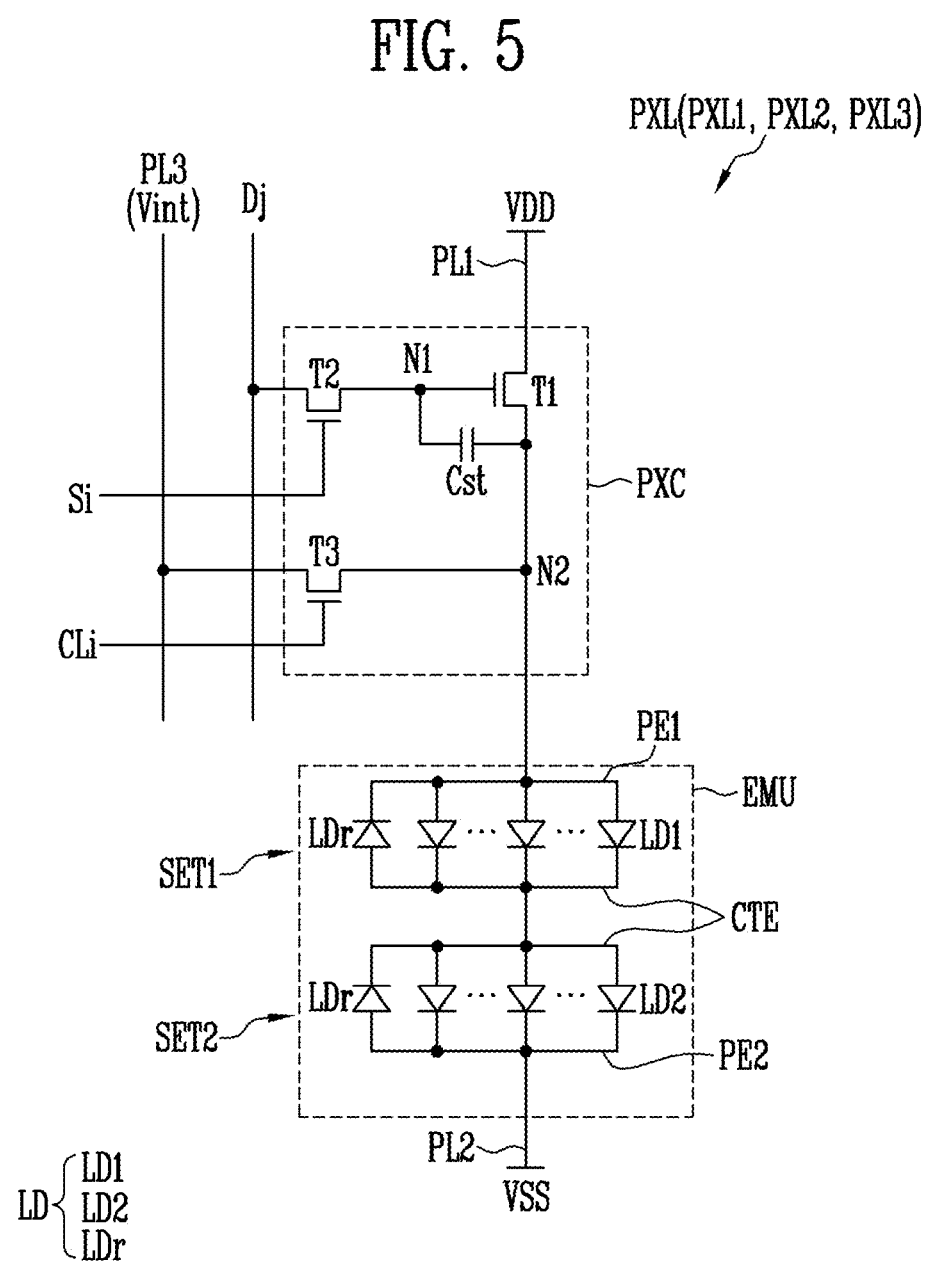

FIG. 5 is a circuit diagram illustrating the pixel included in the display device shown in FIG. 3 in accordance with embodiments of the present disclosure.

In FIG. 5, components identical or similar to the components described with reference to FIG. 4 are designated by like reference numerals, and overlapping descriptions will be omitted. A pixel PXL shown in FIG. 5 may be substantially identical or similar to the structure of the pixel PXL shown in FIG. 4, except a configuration of a light-emitting unit EML.

Referring to FIGS. 1, 2, 3, and 5, the pixel PXL may include a pixel circuit PXC and a light-emitting unit EMU.

In one or more embodiments, the light-emitting unit EMU may include light-emitting stages SET1 and SET2 (or serial stages) including a plurality of light-emitting elements LD connected in parallel to each other. For example, the light-emitting unit EMU may be configured in a series/parallel hybrid structure as shown in FIG. 5.

The light-emitting unit EMU may include first and second light-emitting stages SET1 and SET2 connected in series between the first and second power sources VDD and VSS. Each of the first and second light-emitting stages SET1 and SET2 may include two electrodes PE1 and CTE, or CTE and PE2, constituting an electrode pair of the corresponding stage and a plurality of light-emitting elements LD connected therebetween.

The first light-emitting stage SET1 (or first serial stage) may include a first pixel electrode PE1 and an intermediate electrode CTE, and may include a plurality of first light-emitting elements LD1 connected between the first pixel electrode PE1 and the intermediate electrode CTE. Also, the first light-emitting stage SET1 may include a reverse light-emitting element LDr connected in the opposite direction of a direction in which the first light-emitting elements LD1 are connected between the first pixel electrode PE1 and the intermediate electrode CTE.

The second light-emitting stage SET2 (or second serial stage may include the intermediate electrode CTE and a second pixel electrode PE2, and may include a plurality of second light-emitting elements LD2 connected between the intermediate electrode CTE and the second pixel electrode PE2.

The intermediate electrode CTE may be commonly included in the first light-emitting stage SET1 and the second light-emitting stage SET2. For example, the first light-emitting stage SET1 and the second light-emitting stage SET2 may share the intermediate electrode CTE. However, this is merely illustrative, and the intermediate electrode CTE may be divided into a first intermediate electrode connected to the first light-emitting stage SET1 and a second intermediate electrode connected to the second light-emitting state SET2. The first intermediate electrode and the second intermediate electrode may be electrically and/or physically connected to each other.

Also, the second light-emitting stage SET2 may include a reverse light-emitting element LDr connected in the opposite direction of a direction in which the second light-emitting elements LD2 are connected between the intermediate electrode CTE and the second pixel electrode PE2.

In one or more embodiments, the first pixel electrode PE1 may be an anode of the pixel PXL, and the second pixel electrode PE2 may be a cathode of the pixel PXL. However, this is merely illustrative, and the first pixel electrode PE1 may be the cathode, and the second pixel electrode PE2 may be the anode.

The light-emitting unit EMU having the series/parallel hybrid structure, which is shown in FIG. 5, can decrease a driving current, as compared with a light-emitting unit having a structure in which the light-emitting elements LD are connected only in parallel. Also, the light-emitting unit EMU having the series/parallel hybrid structure, which is shown in FIG. 5, can decrease a driving voltage applied to both ends of the light-emitting unit EMU, as compared with a light-emitting unit having a structure in which the same number of light-emitting elements LD are all connected in series, and thus the light emission efficiency of the light-emitting elements can be improved.

Figure 6:
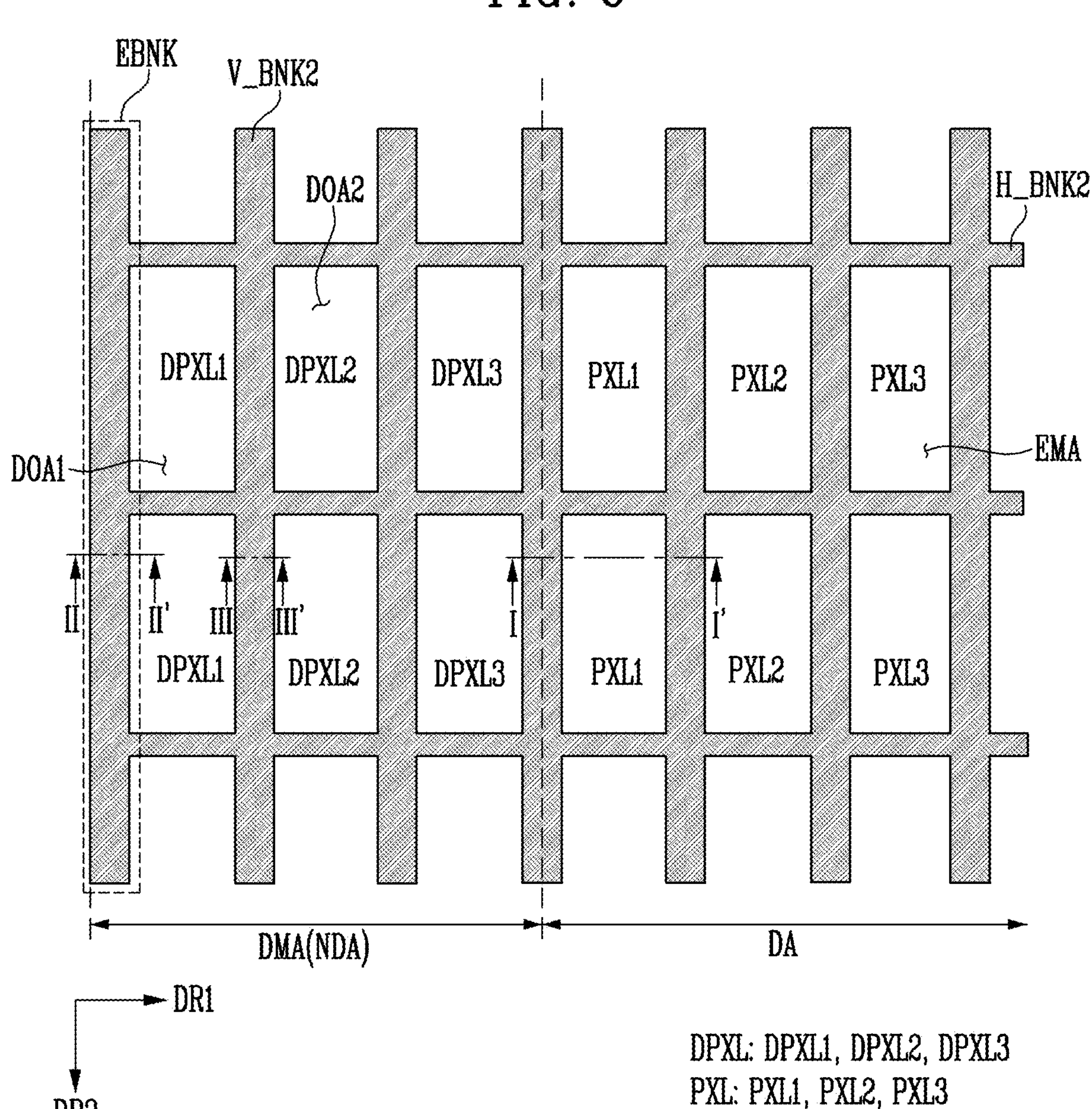
FIG. 6 is a schematic plan view illustrating a second bank included in the display device shown in FIG. 3 in accordance with embodiments of the present disclosure.

FIG. 6 is a schematic plan view illustrating a second bank included in the display device shown in FIG. 3 in accordance with embodiments of the present disclosure.

Referring to FIGS. 3 and 6, the display device DD may include a bank to form pixels PXL and dummy pixels DPXL. For convenience of description, a second bank BNK2 is schematically illustrated in FIG. 6.

The second bank BNK2 may extend in a first direction DR1, and in a second direction DR2 crossing the first direction DR1. The second bank BNK2 may partition emission areas EMA of the pixel PXL and dummy opening areas DOA1 and DOA2 of the dummy pixel DPXL. For example, a portion at which the second bank BNK2 is located may be a non-emission area, and an opening(s) of the second bank BNK2 may correspond to the emission areas EMA or the dummy opening areas DOA1 and DOA2. Light-emitting elements may be located in the opening(s) of the second bank BNK2.

In one or more embodiments, a light conversion layer, which is for controlling a color of light emitted from the pixel PXL, may be filled in the opening(s) of the second bank BNK2. The second bank BNK2 may be a structure defining a position at which the light conversion layer is to be supplied.

The second bank BNK2 may be formed in the display area DA, and in a dummy area DMA as a portion of the non-display area NDA that is adjacent to the display area DA. A first pixel PXL1, a second pixel PXL2, and a third pixel PXL3 of the display area DA may respectively include emission areas EMA for emitting lights of different colors. Light-emitting elements LD may be included in the emission area EMA.

A first dummy pixel DPXL1, a second dummy pixel DPXL2, and a third dummy pixel DPXL3 of the dummy DMA do not emit light. For example, any electrical signal may not be provided to the first dummy pixel DPXL1, the second dummy pixel DPXL2, and the third dummy pixel DPXL3. The dummy area including dummy pixels DPXL having a structure that is similar to a structure of pixels PXL may be located at the outside of the display area DA so as to reduce or prevent the likelihood of a display failure of a screen end area due to a sudden layout change of a display element layer between the display area DA and the non-display area NDA, In some embodiments, there may be no light-emitting elements aligned in the dummy area DMA, and the light-emitting elements may be located in a random arrangement.

In one or more embodiments, the second bank BNK2 may include horizontal extension parts H_BNK2 extending in the first direction DR1, and vertical extension parts V_BNK2 extending in the second direction DR2. In one or more embodiments, a part located at or near an outermost side among the vertical extension part V_BNK2 may be an edge bank EBNK, and the edge bank EBNK may define an outermost boundary of the dummy area DMA.

The edge bank EBNK may have a shape that is different from a shape of vertical extension parts V_BNK2 of the second bank BNK2 at the inside thereof.

The first dummy pixel DPXL1 located at the outermost side of the dummy area DMA may include a first dummy opening area DOA1. The second dummy pixel DPXL2 that is located inwardly of the first dummy pixel DPXL1 may include a second dummy opening area DOA2. In one or more embodiments, the first dummy opening area DOA1 may have a sectional shape that is different from a sectional shape of the second dummy opening area DOA2.

In one or more embodiments, a first bank may be located on the bottom of the second bank BNK2. The first bank may overlap with the second bank BNK2, and may have a planar shape that is similar to a planar shape of the second bank BNK2.

Figure 7:
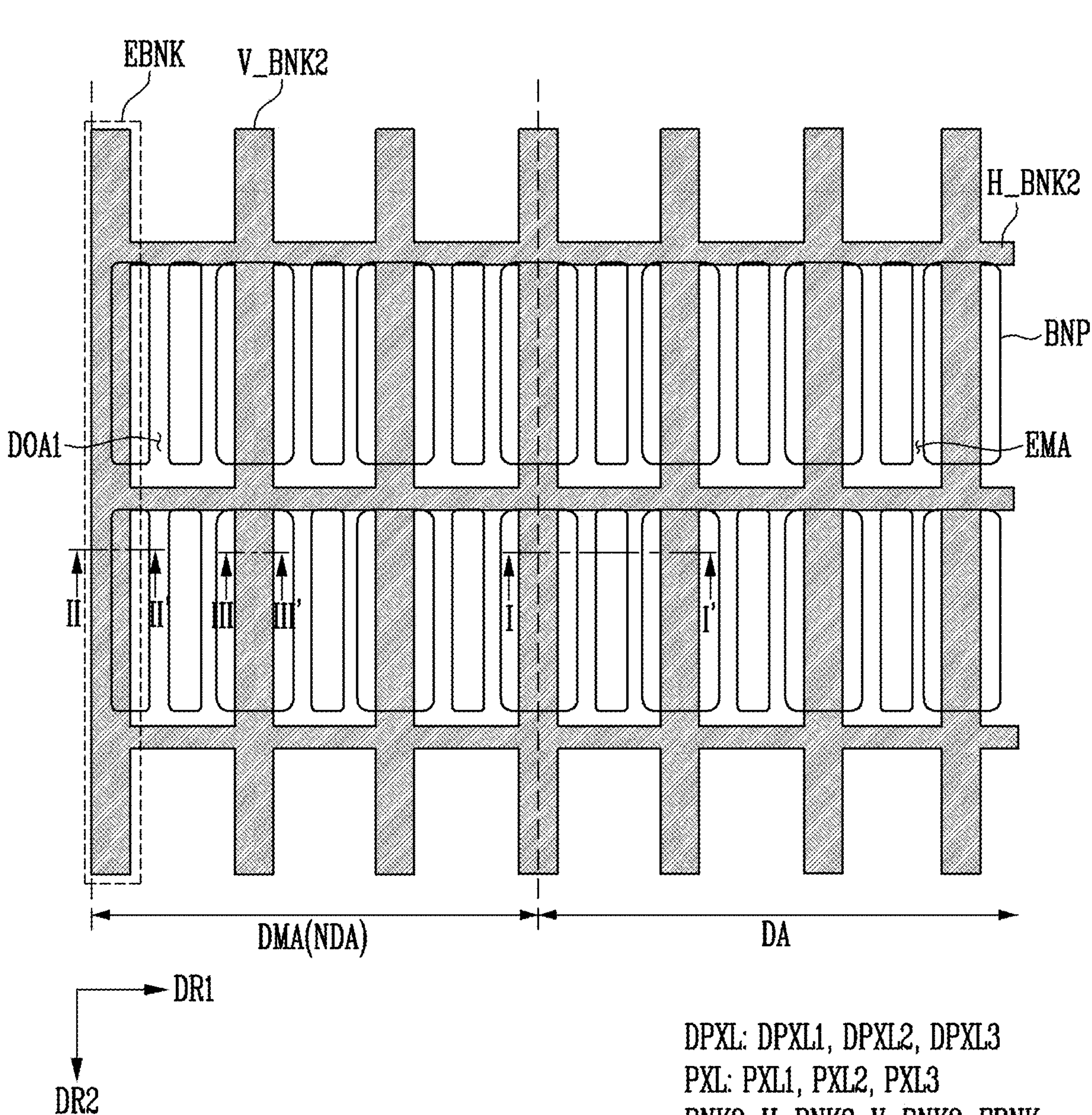
FIG. 7 is a schematic plan view illustrating the second bank and a bank pattern, which are included in the display device shown in FIG. 3, in accordance with embodiments of the present disclosure.

FIG. 7 is a schematic plan view illustrating the second bank and a bank pattern, which are included in the display device shown in FIG. 3, in accordance with embodiments of the present disclosure.

Referring to FIGS. 3, 6, and 7, the display device DD may include a bank pattern BNP for assisting alignment of light-emitting elements.

The bank pattern BNP may be located under the second bank BNK2. When viewed on a plane, light-emitting elements may be aligned between respective bank patterns BNP adjacent to each other in the first direction DR1.

In one or more embodiments, a portion of the bank pattern BNP may be located throughout pixels PXL/dummy pixels DPXL adjacent to each other in the first direction DR1. For example, a portion of the bank pattern BNP may overlap with the second bank BNK2.

The planar shape of the bank pattern BNP shown in FIG. 7 is merely illustrative, and is not limited thereto.

Figure 8:
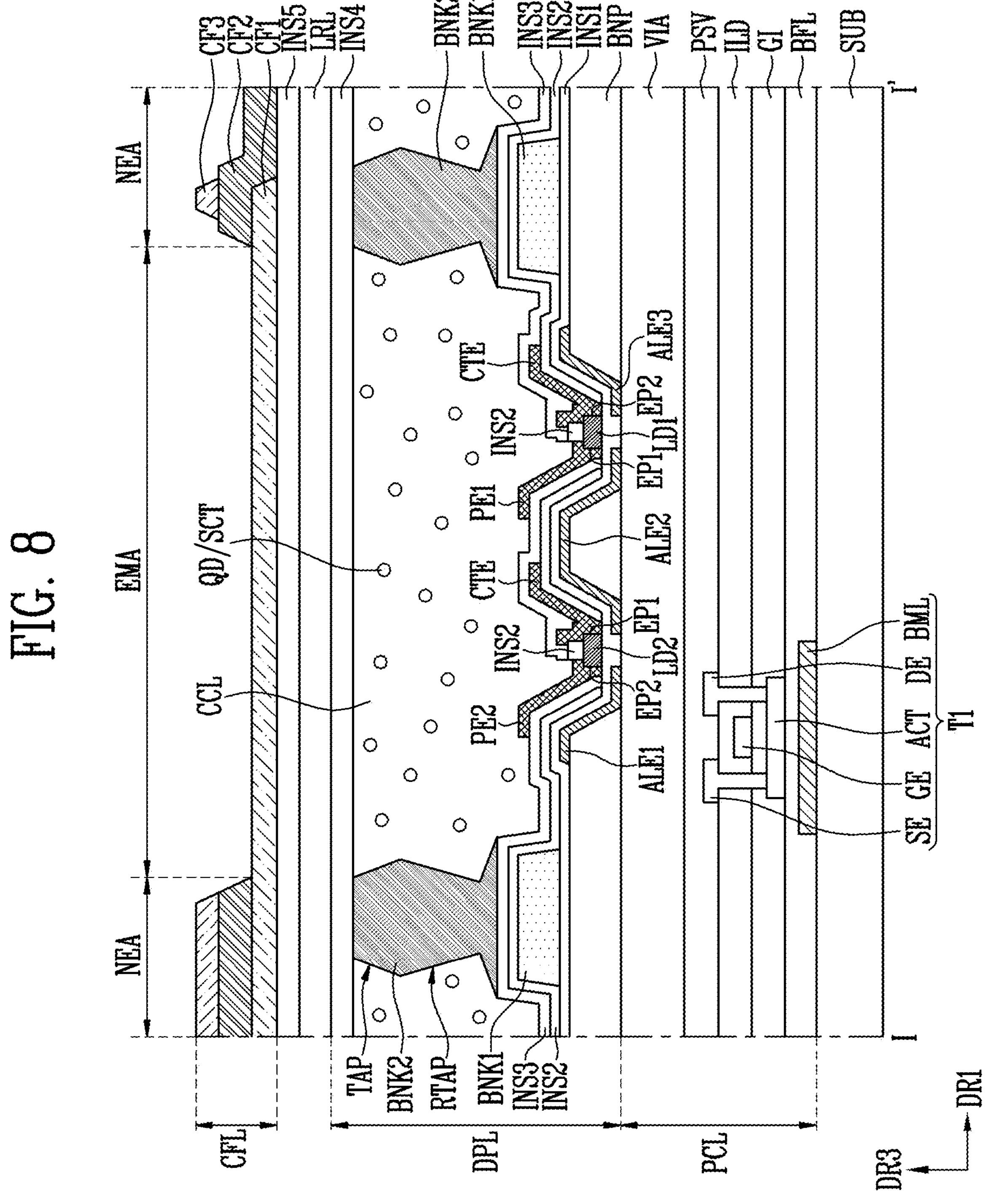
FIG. 8 is a schematic sectional view taken along the line I-I' shown in FIGS. 6 and 7 in accordance with embodiments of the present disclosure.

FIG. 8 is a schematic sectional view taken along the line I-I' shown in FIGS. 6 and 7 in accordance with embodiments of the present disclosure.

Referring to FIGS. 3, 4, 6, 7, and 8, the display device DD or the pixel PXL may include a substrate SUB, a pixel circuit layer PCL, a display element layer DPL, and a color filter layer CFL. In one or more embodiments, the display device DD may further include a low refractive layer LRL and an encapsulation layer.

FIG. 8 schematically illustrates a sectional structure of the pixel PXL of the display area DA in accordance with embodiments of the present disclosure. The second dummy pixel DPXL2 and the third dummy pixel DPXL3 may be similar to the structure shown in FIG. 8, except for lacking components for emitting light.

The substrate SUB may be a rigid substrate, or may be a substrate in a flexible film form. The substrate SUB may be a single-layer or multi-layer substrate or film.

The pixel circuit layer PCL may include a pixel circuit PXC of the pixel PXL. For convenience of description, a first transistor T1 is conceptually illustrated in FIG. 8. A drain electrode DE of the first transistor T1 may be connected to a first power line PL1 located in the pixel circuit layer PCL through a contact hole. A source electrode SE of the first transistor T1 may be electrically connected to a first pixel electrode PE1 through a contact hole.

The pixel circuit layer PCL may include a plurality of insulating layers. For example, the pixel circuit layer PCL may include a buffer layer BFL, a gate insulating layer GI, an interlayer insulating layer ILD, a passivation layer PSV, and a via layer VIA, which are sequentially located on one surface of the substrate SUB.

The pixel circuit layer PCL may include a first conductive layer that is located on the substrate SUB and that includes a bottom metal layer BML.

The first conductive layer may include the bottom metal layer BML, the first power line PL1, and a second power line PL2. The bottom metal layer BML and a gate electrode GE of the first transistor T1 may overlap with each other with the buffer layer BFL interposed therebetween. The bottom metal layer BML may be located under an active pattern ACT of the first transistor T1. For example, the bottom metal layer BML may serve as a light-blocking pattern, thereby stabilizing an operation characteristic of the first transistor T1.

In one or more embodiments, the bottom metal layer BML may be electrically connected to the source electrode SE of the first transistor T1 through a contact hole. Accordingly, a threshold voltage of the first transistor T1 can be shifted in a negative direction or in a positive direction.

The buffer layer BFL may be located on the one surface of the substrate SUB including the first conductive layer. The buffer layer BFL may reduce or prevent the likelihood of an impurity being diffused into each circuit element.

The buffer layer BFL may include an inorganic material. For example, the inorganic material may include at least one of silicon nitride ($SiN_x$), silicon oxide ($SiO_x$), silicon oxynitride ($SiO_xN_y$), and/or metal oxide, such as aluminum nitride ($AlN_x$). A semiconductor layer may be located on the buffer BFL. The semiconductor layer may include the semiconductor pattern ACT. For example, the active pattern ACT may include a channel region overlapping with the gate electrode GE of the first transistor T1, and a source region and a drain region, which are located at both sides of the channel region. The active pattern ACT may be a semiconductor pattern made of polysilicon, amorphous silicon, an oxide semiconductor, or the like.

The gate insulating layer GI may be located over the semiconductor layer. The gate insulating layer GI may include an inorganic material. However, the present disclosure is not limited thereto, and the gate insulating layer GI may include an organic material. For example, the organic material may include at least one of acrylic resin, epoxy resin, phenolic resin, polyamide resin, polyimide resin, unsaturated polyester resin, poly-phenylene ether resin, poly-phenylene sulfide resin, and/or benzocyclobutene resin.

A second conductive layer may be located on the gate insulating layer GI. The second conductive layer may include the gate electrode GE.

The interlayer insulating layer ILD may be located over the second conductive layer. The interlayer insulating layer ILD may include an inorganic material. The interlayer insulating layer ILD may include an organic material.

A third conductive layer may be located on the interlayer insulating layer ILD. The third conductive layer may include the source electrode SE and the drain electrode DE. For example, the source electrode SE of the first transistor T1 may be connected to the source region of the active pattern ACT through a contact hole, and the drain electrode DE of the first transistor T1 may be connected to the drain region of the active pattern ACT through a contact hole.

Each of conductive patterns, electrodes, and/or lines, which constitute the first to third conductive layers, may include at least one conductive material to have conductivity, the material of which being not particularly limited. In one or more embodiments, each of the conductive patterns, the electrodes, and/or the lines, which constitute the first to third conductive layers, may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and/or copper (Cu). In addition, each of the conductive patterns, the electrodes, and/or the lines, which constitute the first to third conductive layers, may include various kinds of conductive materials.

The passivation layer PSV may be located over the third conductive layer. The passivation layer PSV may include an inorganic material. In some embodiments, the passivation layer PSV may be omitted.

Each of the buffer layer BFL, the gate insulating layer GI, the interlayer insulating layer ILD, and the passivation layer PSV may be configured as a single layer or a multilayer, and may include at least one inorganic insulating material and/or an organic insulating material. For example, each of the buffer layer BFL, the gate insulating layer GI, the interlayer insulating layer ILD, and the passivation layer PSV may include various kinds of organic/inorganic insulating materials including silicon nitride ($SiN_x$), silicon oxide ($SiO_x$), silicon oxynitride ($SiO_xN_y$), and the like.

The via layer (or passivation layer) may be entirely located on the passivation layer PSV. The via layer VIA may include an organic material. The via layer VIA may provide a flat surface on the top thereof.

The display element layer DPL may be located on the via layer VIA.

The display element layer DPL may include a light-emitting unit EMU of the pixel PXL. The display element layer DPL may include alignment electrodes ALE1, ALE2, and ALE3, light-emitting elements LD1 and LD2, and electrodes PE1, PE2, and CTE.

The display element layer DPL may include bank patterns BNP, a first insulating layer INS1, a first bank BNK1, a second insulating layer INS2, and a third insulating layer INS3. The display element layer DPL may further include a second bank BNK2 and a light conversion layer CCL.

The bank patterns BNP may be provided on the via layer VIA. The bank patterns BNP may overlap with the alignment electrodes ALE, and may be arranged while being spaced apart from each other in the first direction DR1.

By the bank patterns BNP, a portion of each of the alignment electrodes ALE1, ALE2, and ALE3 may protrude in an upper direction (e.g., a third direction DR3) at the periphery of the light-emitting elements LD1 and LD2. By the bank patterns BNP and the alignment electrodes ALE1, ALE2, and ALE3 on the top thereof, reflective protrusion patterns are formed at the periphery of the light-emitting elements LD, and the light efficiency of the pixel PXL can be improved.

The bank patterns BNP may include an inorganic insulating layer made of an inorganic material or an organic insulating layer made of an organic material. The alignment electrodes ALE1, ALE2, and ALE3 may be formed on the bank patterns BNP.

The alignment electrodes ALE1, ALE2, and ALE3 may include at least one conductive material. Also, the alignment electrodes ALE1, ALE2, and ALE3 may include the same conductive material, or may include different conductive materials.

Each of the alignment electrodes ALE1, ALE2, and ALE3 may be configured as a single layer or a multilayer. In one or more embodiments, the alignment electrodes ALE1, ALE2, and ALE3 may include a reflective electrode layer including a reflective conductive material (e.g., a metal). Also, the alignment electrodes ALE may selectively further include at least one of a transparent electrode layer located on the top and/or the bottom of the reflective electrode layer, and/or a conductive capping layer covering the top of the reflective electrode layer and/or the transparent electrode layer.

Although a case where a first alignment electrode ALE1 and a third alignment electrode ALE3 do not extend to the bottom of the first bank BNK1 is illustrated in FIG. 8, the present disclosure is not limited thereto. For example, at least one of the first alignment electrode ALE1 and/or the third alignment electrode ALE3 may extend to the bottom of the first bank BNK1.

The first insulating layer INS1 may be located over the alignment electrodes ALE1, ALE2, and ALE3. The first insulating layer INS1 may be entirely formed on the display area DA in which the alignment electrodes ALE1, ALE2, and ALE3 are formed. In one or more other embodiments, the first insulating layer INS1 may be locally located only on the bottom of an area in which the light-emitting elements LD1 and LD2 are arranged.

The first insulating layer INS1 may be configured as a single layer or a multilayer, and may include at least one inorganic insulating material and/or at least one organic insulating material.

As the alignment electrodes ALE1, ALE2, and ALE3 are covered by the first insulating layer INS1, damage to the alignment electrodes ALE1, ALE2, and ALE3 in a subsequent process can be reduced or prevented. In addition, the electrical stability of the alignment electrodes ALE1, ALE2, and ALE3 can be ensured.

The first bank BNK1 may be located on the first insulating layer INS1. In one or more embodiments, the first bank BNK1 may include an opening corresponding to each emission area EMA or a dummy opening area (e.g., DOA1 or DOA2), and surrounding the emission area EMA or the dummy opening area (e.g., DOA1 or DOA2).

The light-emitting elements LD1 and LD2 may be supplied to each emission area EMA surrounded by the first bank BNK1. The light-emitting elements LD1 and LD2 may be aligned between respective ones of the alignment electrodes ALE1, ALE2, and ALE3 by alignment signals applied to the alignment electrodes ALE1, ALE2, and ALE3.

In one or more embodiments, the light-emitting elements LD1 and LD2 may be light-emitting elements of the same first color. For example, the light-emitting elements LD1 and LD2 may be all blue light-emitting elements for emitting light of blue.

When a first pixel PXL1 is a red pixel, a light conversion layer CCL including a red-light conversion particle QD (e.g., a red quantum dot) may be located above light-emitting elements LD1 and LD2 of the first pixel PXL1.

When a second pixel PXL2 is a green pixel, a light conversion layer CCL including a green-light conversion particle QD (e.g., a green quantum dot) may be located above light-emitting elements LD1 and LD2 of the second pixel PXL2.

When a third pixel PXL3 is a blue pixel, light scattering particles SCT may be located above light-emitting elements LD1 and LD2 of the third pixel PXL3.

The second insulating layer INS2 (also, referred to as an "insulating pattern") may be located on a portion of each of the light-emitting elements LD1 and LD2. In one or more embodiments, the second insulating layer INS2 may be locally located on a portion of each of the light-emitting elements LD to expose first and second end portions EP1 and EP2 of each of the light-emitting elements LD1 and LD2.

The second insulating layer INS2 may stably fix the light-emitting elements LD, and may reduce or prevent the likelihood of a short circuit between adjacent pixel electrodes PE.

The second insulating layer INS2 may be configured as a single layer or a multilayer, and may include at least one inorganic insulating material and/or at least one organic insulating material. For example, the second insulating layer INS2 may include various kinds of organic/inorganic insulating materials including silicon nitride ($SiN_x$), silicon oxide ($SiO_x$), silicon oxynitride ($SiO_xN_y$), aluminum oxide ($Al_xO_y$), a photoresist material, and/or the like.

In one or more embodiments, the second insulating layer INS2 may expose sides including the first and second end portions EP1 and EP2 of the light-emitting elements LD1 and LD2, and may extend to be located on the first insulating layer INS1 and the first bank BNK1.

The electrodes PE1, PE2, and CTE may be formed on the first and second end portions EP1 and EP2 of the light-emitting elements LD. For example, the first pixel electrode PE1 may be located on a first end portion EP1 of a first light-emitting element LD1, and an intermediate electrode CTE may be located on a second end portion EP2 of the first light-emitting element LD1 and on a first end portion EP1 of a second light-emitting element LD2. A second pixel electrode PE2 may be located on a second end portion EP2 of the second light-emitting element LD2.

The electrodes PE1, PE2, and CTE may be formed in the same layer or in different respective layers. For example, as shown in FIG. 8, after the intermediate electrode CTE is first formed on the second insulating layer INS2, the third insulating layer INS3 covering the intermediate electrode CTE may be formed, and the first and second pixel electrodes PE1 and PE2 may be formed on the third insulating layer INS3. However, this is merely illustrative, and the mutual positions and/or the formation order of the first pixel electrode PE1, the second pixel electrode PE2, and the intermediate electrode CTE may be variously changed in some embodiments.

The first pixel electrode PE1, the second pixel electrode PE2, and the intermediate electrode CTE may include at least one conductive material. In one or more embodiments, the first pixel electrode PE1, the second pixel electrode PE2, and the intermediate electrode CTE may include a transparent conductive material such that light emitted from the light-emitting elements LD1 and LD2 can be transmitted therethrough.

In one or more embodiments, the third insulating layer INS3 covering the intermediate electrode CTE may extend to cover the first bank BNK1 on the second insulating layer INS2. However, this is merely illustrative, and the third insulating layer INS3 may be provided in a pattern form covering only the intermediate electrode CTE.

In one or more embodiments, each of the second pixel electrode PE2 and the intermediate electrode CTE in contact with the first light-emitting element LD1 may extend onto an adjacent first bank BNK1.

The light conversion layer CCL may be provided in the emission area EMA to be located above the light-emitting elements LD1 and LD2. The light conversion layer CCL may include at least one of the light conversion particles QD and/or the light scattering particles SCT corresponding to a light-emitting color of the pixel PXL.

The second bank BNK2 may be located to overlap with the first bank BNK1. In one or more embodiments, the second bank BNK2 may be located on the third insulating layer INS3. The second bank BNK2 may have/define an opening corresponding to the emission area EMA. The second bank BNK2 may define and/or partition the emission area EMA in which the light conversion layer CCL is to be formed.

The second bank BNK2 may include a light-blocking material and/or a reflective material including a black matrix material and the like. The second bank BNK2 may include the same material as the first bank BNK1, or may include a material that is different from a material of the first bank BNK1. A portion overlapping with the second bank BNK2 may be the non-emission area NEA.

In one or more embodiments, the second bank BNK2 may be formed through a photo mask process on a light-blocking photoresist coated on the entire surface thereof. The second bank BNK2 formed to define the light conversion layer CCL may be formed to have a height of about 10 μm or higher. However, a curing profile may vary according to a height (or depth) of the photoresist in a corresponding photo exposure process. In addition, an amount of light irradiated through an edge portion of a mask, which corresponds to an edge portion of the second bank BNK2, is relatively small as compared with other portions, and hence only a reverse tapered face RTAP is formed. For example, a depth down to about 4 μm from a top surface of the second bank BNK2 has a tapered face TAP of which sectional area becomes wider in a direction toward the bottom, but the reverse tapered face RTAP may be formed below, or in a depth under, the tapered face TAP. For example, as shown in FIG. 8, the second bank BNK2 may have the reverse tapered face RTAP.

A fourth insulating layer INS4 may be located on the second bank BNK2 and the light conversion layer CCL. In one or more embodiments, the fourth insulating layer INS4 may include an inorganic insulating layer. For example, the fourth insulating layer INS4 may include silicon oxide ($SiO_x$) or silicon oxynitride ($SiO_xN_y$). In one or more embodiments, silicon nitride ($SiN_x$) may deteriorate the light efficiency of the pixel PXL. Therefore, the silicon nitride ($SiN_x$) may be excluded from the material of the fourth insulating layer INS4.

The fourth insulating layer INS4 is a capping layer, and may protect the light-emitting unit EMU and the light conversion layer CCL. Also, the fourth insulating layer INS4 may reduce or prevent the likelihood of moisture infiltrating into the light-emitting unit EMU and the light conversion layer CCL.

The low refractive layer LRL may be located on the fourth insulating layer INS4. The low refractive layer LRL may be entirely located on the fourth insulating layer INS4. The low refractive layer LRL may include an inorganic material or an organic material.

In some embodiments, the low refractive layer LRL may allow light emitted from the light conversion layer CCL (e.g., light advancing in an oblique direction) to be totally reflected by using a refractive index difference between the low refractive layer LRL and an adjacent component, and may improve the light emission efficiency of the pixel PXL. To this end, the low refractive layer LRL may have a refractive index that is relatively low as compared with the light conversion layer CCL.

A fifth insulating layer INS5 may be located on the low refractive layer LRL, and may include an inorganic material. The fifth insulating layer INS5 may reduce or prevent the likelihood of moisture infiltrating into the low refractive layer LRL. For example, the fifth insulating layer INS5 may include silicon oxide ($SiO_x$) or silicon oxynitride ($SiO_xN_y$). In one or more embodiments, silicon nitride ($SiN_x$) may deteriorate the light efficiency of the pixel PXL. Therefore, the silicon nitride ($SiN_x$) may be excluded from the material of the fifth insulating layer INS5 in some embodiments.

A first color filter CF1, a second color filter CF2, and a third color filter CF3 may be located on the fifth insulating layer INS5. Each of the first, second, and third color filters CF1, CF2, and CF3 may have a color of a corresponding pixel PXL.

For example, the first color filter CF1 may be located in the emission area EMA of the first pixel PXL1, the second color filter CF2 may be located in the emission area EMA of the second pixel PXL2, and the third color filter CF3 may be located in the emission area EMA of the third pixel PXL3. Each of the first, second, and third color filters CF1, CF2, and CF3 may include a color filter material for allowing light of a corresponding color, which is converted in the light conversion layer CCL, to be selectively transmitted therethrough. In one or more embodiments, the first color filter CF1 may be a red color filter, the second color filter CF2 may be a green color filter, and the third color filter CF3 may be a blue color filter.

The first, second, and third color filters CF1, CF2, and CF3 are located to overlap with each other in the non-emission area. Thus, the first, second, and third color filters CF1, CF2, and CF3 can block or reduce light interference between adjacent sub-pixels. In some embodiments, a separate light-blocking pattern may be located in the non-emission area, instead of a stacked structure of the first, second, and third color filters CF1, CF2, and CF3.

Figure 9:
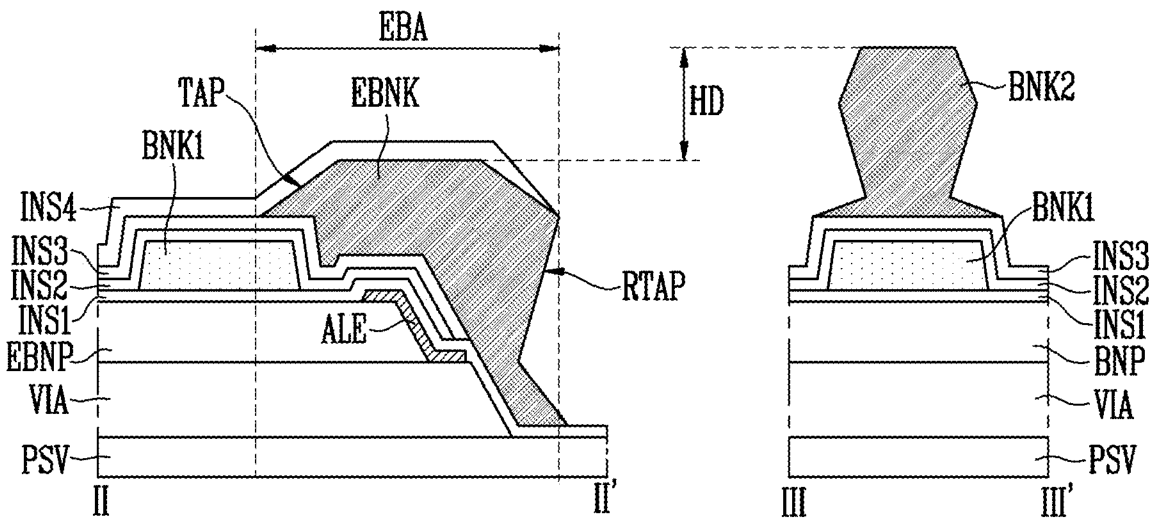
FIG. 9 is a schematic sectional view taken along the lines II-II' and III-III' shown in FIGS. 6 and 7 in accordance with embodiments of the present disclosure.
Figure 9:
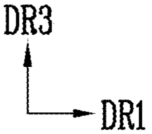
Figure 10:
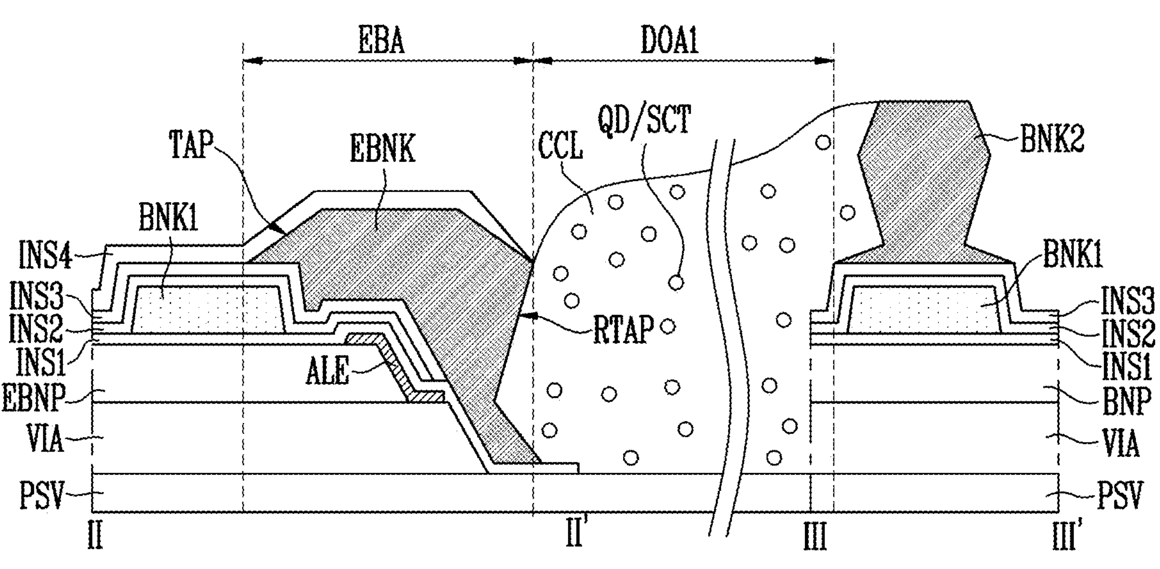
FIG. 10 is a schematic sectional view of a first dummy opening area shown in FIG. 6 in accordance with embodiments of the present disclosure.
Figure 10:

FIG. 9 is a schematic sectional view taken along the lines II-II' and III-III' shown in FIGS. 6 and 7 in accordance with embodiments of the present disclosure. FIG. 10 is a schematic sectional view illustrating the first dummy opening area shown in FIG. 6 in accordance with embodiments of the present disclosure.

Referring to FIGS. 3, 4, 6, 7, 8, 9, and 10, the second bank BNK2 may include an edge bank EBNK defining an outermost boundary of the dummy area DMA.

In FIGS. 9 and 10, for convenience of description, illustration of components under the passivation layer PSV is omitted, and repeated detailed illustration of components at the periphery of the edge bank EBNK in the display element layer DPL and a stacked structure of the first dummy opening area DOA1 are also omitted. In addition, the display element layer DPL and the second bank BNK2, which are taken along the line III-III', are substantially identical or similar to a stacked structure in the non-emission area NEA, and therefore, overlapping descriptions will be omitted.

An area in which the edge bank EBNK is located, or an area overlapping with the edge bank EBNK, may be an edge bank area EBA. In addition, the bank pattern BNP overlapping with the edge bank EBNK may be an edge bank pattern EBNP.

In one or more embodiments, the first insulating layer INS1, the first bank BNK1, the second insulating layer INS2, and the third insulating layer INS3 may be sequentially stacked on the via layer VIA in the area in which the edge bank EBNK is located. Although a case where the alignment electrode ALE is located on the edge bank EBNK is illustrated in FIG. 9, the present disclosure is not limited thereto. For example, conductive layers of the display element layer DPL may all be removed in the edge bank area EBA. Alternatively, at least one of the first pixel electrode PE1, the second pixel electrode PE2, and/or the intermediate electrode CTE may extend to the edge bank area EBA.

An outer portion of the edge bank EBNK may seal the display element layer DPL at a side of the dummy area DMA as the non-display area NDA. When the edge bank EBNK is located in the same shape as another second bank BNK2 therein, a reverse tapered face RTAP may be formed as described with reference to FIG. 8. When the fourth insulating layer INS4 as a capping layer is located on this existing edge bank shape, capping of the fourth insulating layer INS4 with respect to the outer reverse tapered face RTAP of the edge bank becomes weak.

For example, a capping weak portion, such as a portion at which the fourth insulating layer INS4 is cut, and/or a portion at which the thickness of the fourth insulating layer INS becomes thin, may exist due to the outer reverse tapered face RTAP of the edge bank. The capping weak portion of the fourth insulating layer INS4 is weak or susceptible to moisture infiltration from the outside, and the electrodes PE1, PE2, and CTE in the display area DA may be damaged due to the moisture infiltration.

To solve this problem, the edge bank EBNK may have a shape shown in FIG. 9. For example, an outer inclined surface of the edge bank EBNK may be located on a portion of the first bank BNK1, and may have only a tapered face TAP. That is, the outer inclined surface of the edge bank EBNK may be formed not to have the reverse tapered face RTAP. Thus, as shown in FIG. 9, the fourth insulating layer INS4 can be stably formed on the edge bank EBNK without any capping weak portion, such as a portion at which the thickness of the fourth insulating layer INS4 becomes thin. Further, the low refractive layer LRL on the fourth insulating layer INS4, and the fifth insulating layer INS5 capping the low refractive layer LRL, can also be stably formed.

In other words, an outer side of the edge bank EBNK may have a relatively thin thickness so as not to have the reverse tapered face RTAP. As described above, when the photoresist for forming the second bank BNK2 has a corresponding thickness (e.g., a thickness of a predetermined value or more), a lower reverse tapered face RTAP may occur due to the limitation of a photo process. The thickness of the outer side of the edge bank EBNK, which may be weak to moisture infiltration, is formed thin to a degree to which the reverse tapered face RTAP does not occur, so that deterioration of reliability due to the moisture infiltration can be reduced.

In one or more embodiments, the edge bank EBNK may cover an inner side of the edge bank pattern EBNP and an inner side of a portion of the first bank BNK1, which overlaps with the edge bank EBNK. An inner inclined surface of the edge bank EBNK may have the reverse tapered face RTAP. For example, a portion including an inner side of the edge bank EBNK may be located to cover even the via layer VIA from the third insulating layer INS3. Therefore, the inner inclined surface of the edge bank EBNK may be formed to have the tapered face TAP and the reverse tapered face RTAP in the photo process.

A portion of the via layer VIA that corresponds to the edge bank area EBA may be removed so as to form the above-described shape of the edge bank EBNK. For example, the edge bank area EBA may include the portion at which the via layer VIA is removed. The edge bank area EBA may cover one side of the via layer VIA.

The lower passivation layer PSV at the portion at which the via layer VIA is removed may be exposed from the via layer VIA. Accordingly, a thickness of the inner side of the edge bank EBNK may be similar to a thickness of the another second bank BNK2.

Although a case where the portion of the via layer VIA is removed such that the passivation layer PSV is exposed has been illustrated in FIG. 9, the present disclosure is not limited thereto. For example, only a partial thickness of the portion of the via layer VIA may be removed so as to determine the thickness of the edge bank EBNK.

In one or more embodiments, the insulating layer INS1 may be located over the exposed passivation layer PSV along the removed via layer VIA. In one or more embodiments, the second insulating layer INS2 and the third insulating layer INS3 may be located while overlapping with the via layer VIA. The edge bank EBNK may be in contact with the first insulating layer INS1.

Therefore, a step difference between the outer side and the inner side according to the arrangement structure of the via layer VIA, the edge bank pattern EBNP, the first insulating layer INS1, the first bank BNK2, the second insulating layer INS2, and the third insulating layer INS3 may be formed in the edge bank area EBA. The edge bank EBNK may be located to cover this step difference. In one or more embodiments, an end of the outer inclined surface of the edge bank EBNK may be located to be higher than an end of the inner inclined surface of the edge bank EBNK. For example, the end of the outer inclined surface of the edge bank EBNK may be located on the third insulating layer INS3, and the end of the inner inclined surface of the edge bank EBNK may be located on the first insulating layer INS1.

In one or more embodiments, a height of a top surface of the edge bank EBNK may be lower than a height of a top surface of another portion of the second bank BNK2. For example, as shown in FIG. 9, the top surface of the edge bank EBNK and the top surface of another portion of the second bank BNK2 may have a height difference (e.g., a predetermined height difference) HD.

As shown in FIG. 10, the light conversion layer CCL may be filled in the first dummy opening area DOA1 formed (defined) by the edge bank EBNK.

As described above, the display device DD in accordance with the embodiments of the present disclosure includes the edge bank EBNK having the outer inclined surface from which the reverse tapered face RTAP is removed, unlike other portions at an inner side of the second bank BNK2, so that the fourth and fifth insulating layers INS4 and INS5 used for lower capping can be stably located with a substantially uniform thickness. Thus, moisture infiltration through the edge bank EBNK can be reduced or prevented, and deterioration of reliability due to the moisture infiltration can be reduced.

Figure 11:
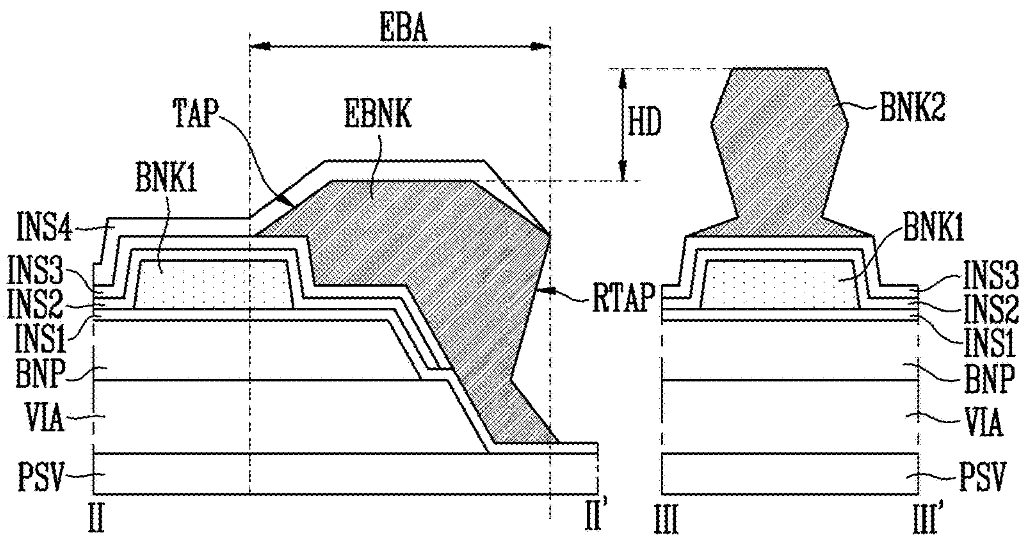
FIG. 11 is a schematic sectional view illustrating another example taken along the lines II-II' and III-III' shown in FIGS. 6 and 7.
Figure 11:
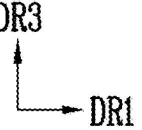
Figure 12:
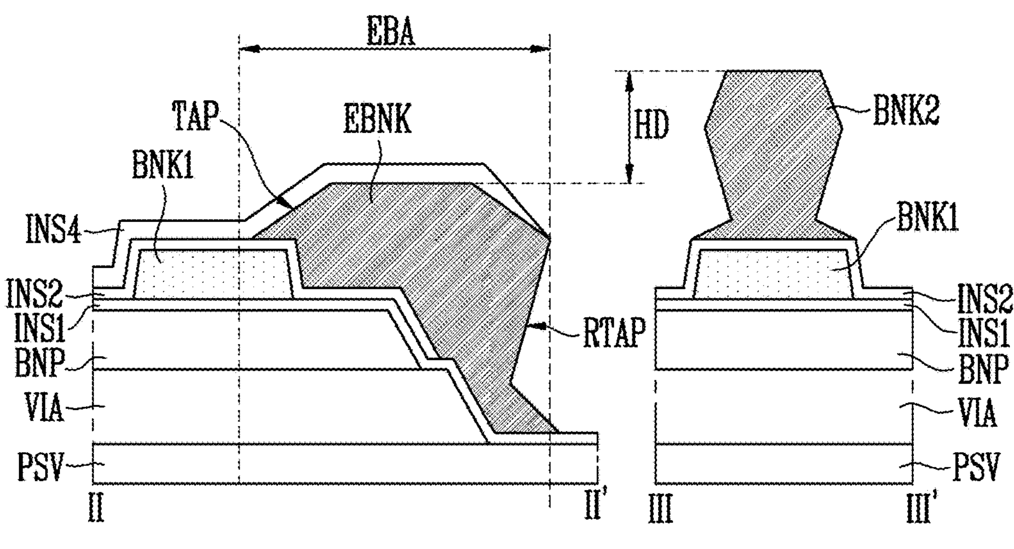
FIG. 12 is a schematic sectional view illustrating still another example taken along the lines II-II' and III-III' shown in FIGS. 6 and 7.
Figure 12:

FIG. 11 is a schematic sectional view illustrating another example taken along the lines II-II' and III-III' shown in FIGS. 6 and 7. FIG. 12 is a schematic sectional view illustrating still another example taken along the lines II-II' and III-III' shown in FIGS. 6 and 7.

In FIGS. 11 and 12, descriptions of portions overlapping with the portions described with reference to FIG. 9 will not be repeated.

Referring to FIGS. 6, 11, and 12, the second bank BNK2 may include an edge bank EBNK defining an outermost boundary of the dummy area DMA.

In one or more embodiments, as shown in FIGS. 11 and 12, the alignment electrode may be omitted in the edge bank are EBA. Alternatively, as shown in FIG. 12, the third insulating layer INS3 over the second insulating layer INS2 may be omitted. That is, unnecessary components in the dummy area DMA are omitted, so that manufacturing cost can be saved.

Figure 13:
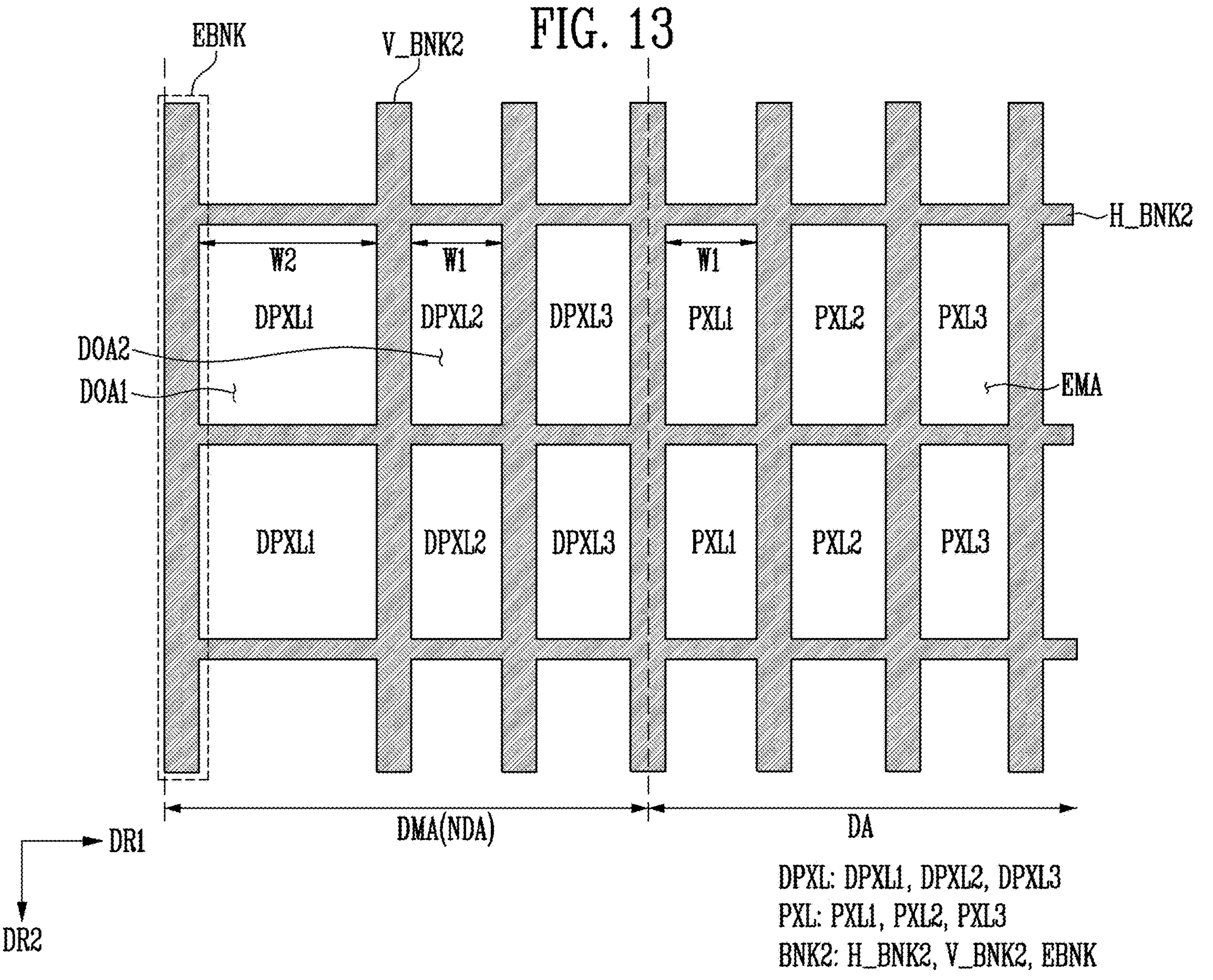
FIG. 13 is a schematic plan view illustrating a second bank included in the display device shown in FIG. 3 in accordance with embodiments of the present disclosure.
Figure 14A:
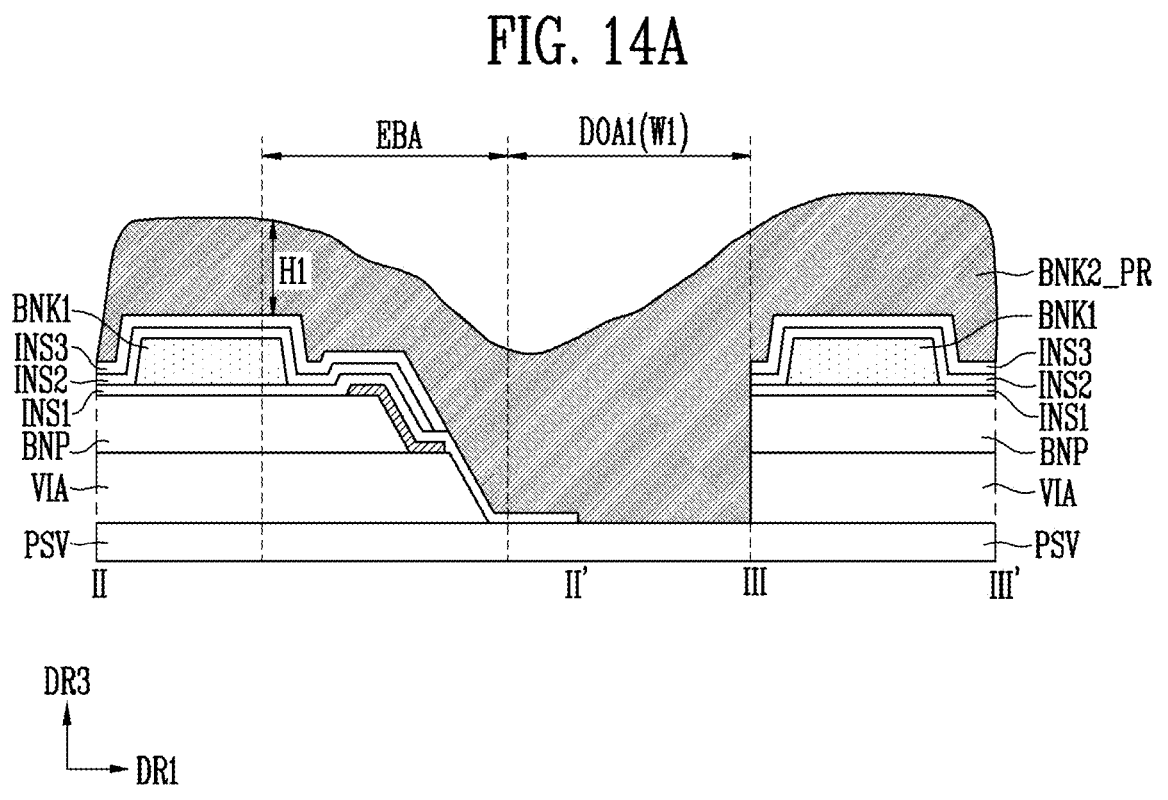
Figure 14B:
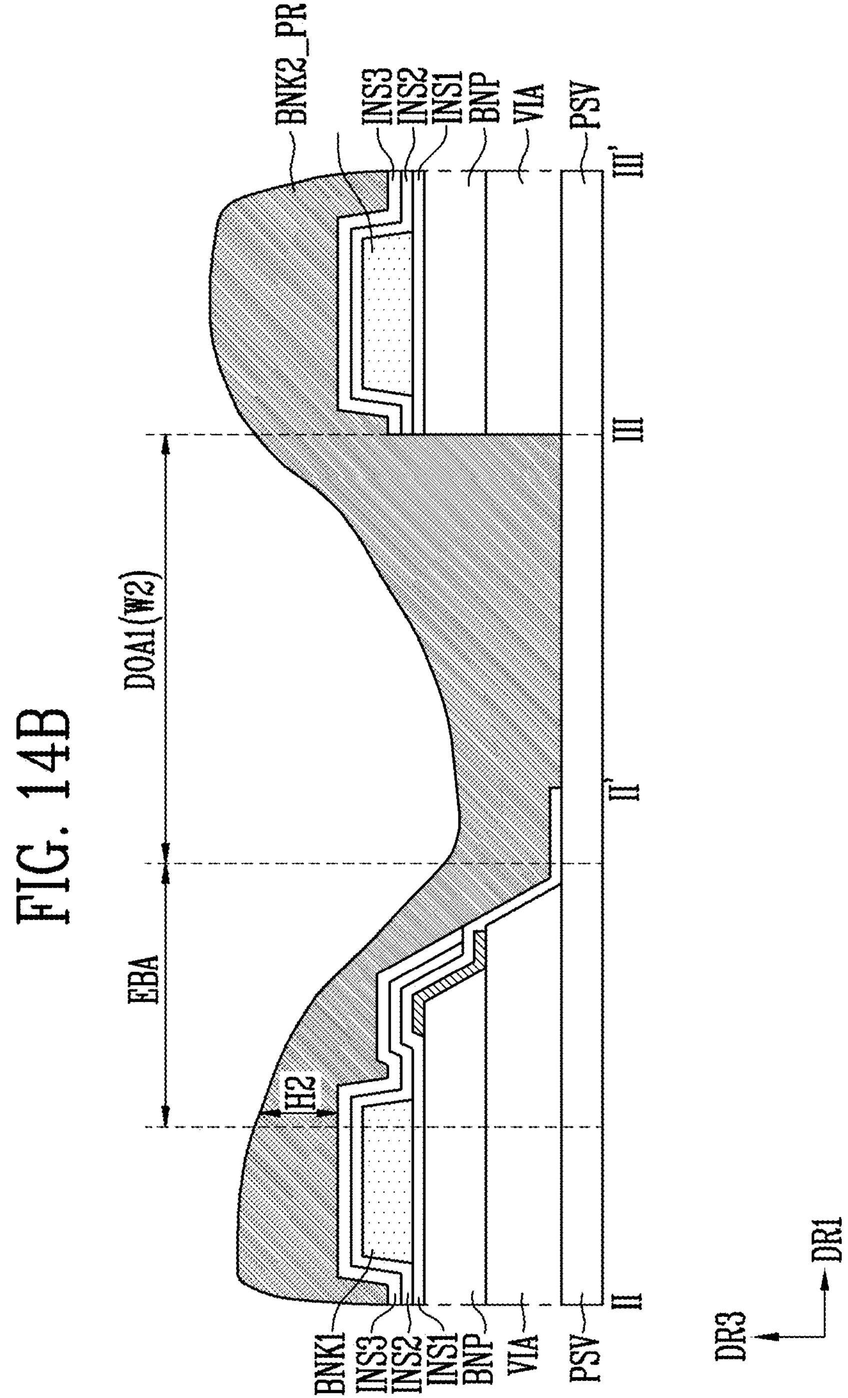

FIG. 13 is a schematic plan view illustrating the second bank included in the display device shown in FIG. 3 in accordance with embodiments of the present disclosure. FIGS. 14A and 14B are schematic sectional views illustrating a photoresist for forming the second bank is located according to the width of the dummy opening area in accordance with embodiments of the present disclosure.

Referring to FIGS. 3, 10, 13, 14A, and 14B, a width (e.g., a second width W2) of the first dummy opening area DOA1 in the first direction DR1 may be greater than a width (e.g., a first width W1) of the emission area EMA of each of the pixels PXL in the first direction DR1. Also, the second width W2 may be greater than a width of the second dummy opening area DOA2 in the first direction DR1.

In some embodiments, the width of the second dummy opening area DOA2 in the first direction DR1 may be substantially equal to the first width W1.

FIGS. 14A and 14B illustrate examples in which a photoresist BNK2_PR for forming the second bank BNK2 is coated. FIG. 14A may illustrate a sectional profile of the photoresist BNK2_PR according to the structure of the second bank BNK2 shown in FIG. 6. FIG. 14B may illustrate a sectional profile of the photoresist BNK2_PR according to the structure of the second bank BNK2 shown in FIG. 13.

For example, as a width W1 or W2 of the first dummy opening area DOA1 in the first direction DR1 becomes larger, a lower follow-up of the photoresist BNK2_PR with respect to the first dummy opening area DOA1 may become larger. Therefore, a height of the photoresist BNK2_PR in an area (e.g., the edge bank area EBA) in which the edge bank pattern EBNP is formed may vary according to the width (W1 or W2) of the first dummy opening area DOA1 in the first direction DR1.

For example, as shown in FIG. 14A, when the dummy opening area DOA1 has the first width W1, the photoresist BNK2_PR may be deposited with a first thickness H1 in a portion of the edge bank area EBA, which overlaps with the first bank BNK1. As shown in FIG. 14B, when the dummy opening area DOA1 has the second width W2, the photoresist BNK2_PR may be deposited with a second thickness H2 that is less than the first thickness H1 in a portion of the edge bank area EBA, which overlaps with the first bank BNK1.

As described above, as the thickness of the photoresist BNK2_PR on the first bank BNK1 becomes smaller, the probability that the reverse tapered face RTA will be formed at the outer side of the edge bank EBNK may become lower. Therefore, as shown in FIG. 13, the second width W2 may be greater than the first width W1.

Figure 15:
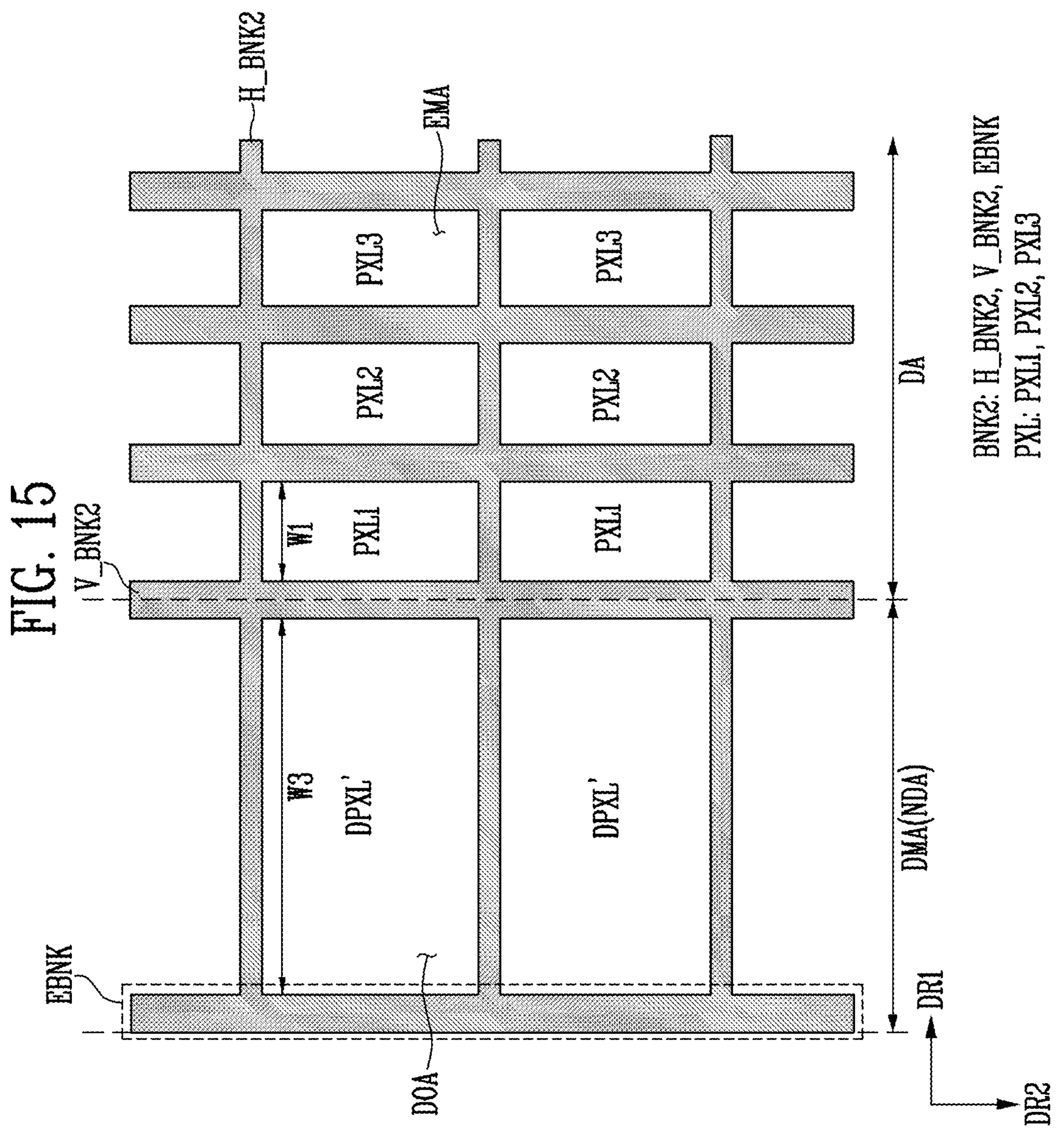
FIG. 15 is a schematic plan view illustrating the second bank included in the display device shown in FIG. 3 in accordance with embodiments of the present disclosure.
Figure 16:
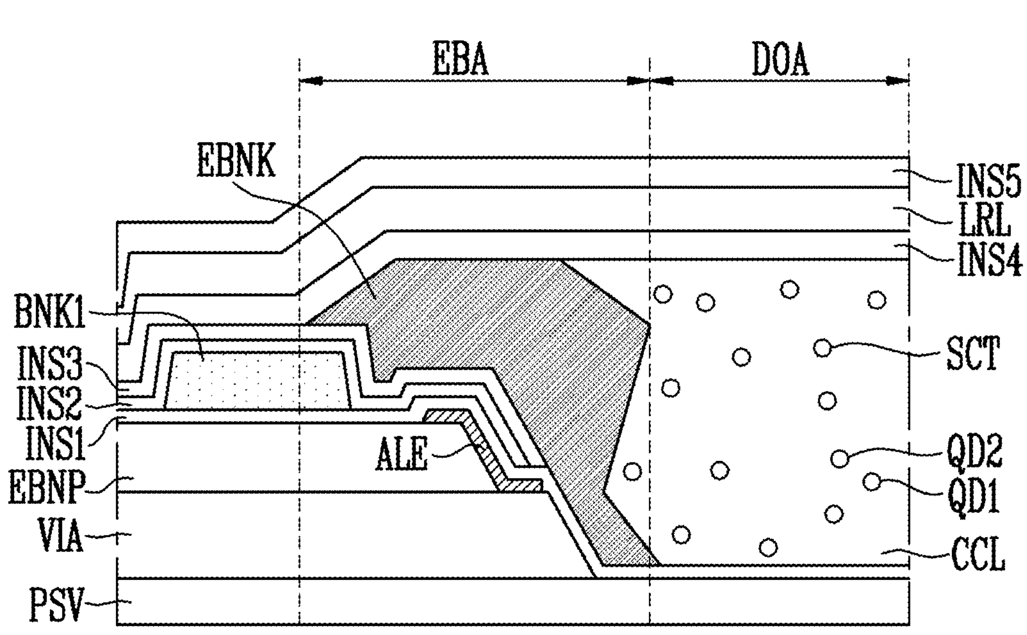
FIG. 16 is a schematic sectional view illustrating a dummy opening area shown in FIG. 15 in accordance with embodiments of the present disclosure.
Figure 16:
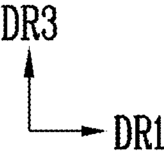

FIG. 15 is a schematic plan view illustrating the second bank included in the display device shown in FIG. 3 in accordance with embodiments of the present disclosure. FIG. 16 is a schematic sectional view illustrating a dummy opening area shown in FIG. 15 in accordance with embodiments of the present disclosure.

Referring to FIGS. 15 and 16, a width (e.g., a third width W3) of a dummy opening area DOA in the first direction DR1 may be greater than the width (e.g., the first width W1) of the emission area EMA of each of the pixels PXL in the first direction DR1.

In one or more embodiments, a dummy pixel DPXL' of the dummy area DMA may be formed in a form in which first, second, and third pixels PXL1, PXL2, and PXL3 are integrated. For example, as compared with the second bank BNK2 shown in FIG. 6, the vertical extension parts V_BNK2 of the second bank BNK2, which partition first, second, and third dummy pixels DPXL1, DPXL2, and DPXL3, may be omitted. Through the structure described above, a width (e.g., the third width W3) of an outermost dummy pixel DPXL' can be sufficiently secured.

In one or more embodiments, as shown in FIG. 16, red light conversion particles QD1, green light conversion particles QD2, and light scattering particles SCT may be included in the light conversion layer CCL filled in the dummy opening area DOA of the dummy pixel DPXL'. However, this is merely illustrative, and only some of the red light conversion particles QD1, the green light conversion particles QD2, and the light scattering particles SCT may be included in the light conversion layer CCL of the dummy pixel DPXL'.

As described above, the display device in accordance with the embodiments of the present disclosure includes an edge bank having an outer inclined surface from which a reverse tapered face is removed, unlike other portions of the inner side of the second bank. Thus, the fourth and fifth insulating layers for lower capping can be stably located with a substantially uniform thickness. Accordingly, moisture infiltration through the edge bank can be reduced or prevented, and deterioration of reliability due to the moisture infiltration can be reduced.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with one or more embodiments may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, with functional equivalents thereof to be included therein.

What is claimed is:

1. A display device comprising:

a substrate comprising a display area comprising pixels, and a dummy area adjacent to at least one side of the display area and comprising dummy pixels;

a pixel circuit layer comprising a transistor, and a via layer above the transistor;

bank patterns above the via layer;

light-emitting elements between the bank patterns in plan view;

a first bank above a portion of the bank patterns, and extending in a first direction and in a second direction crossing the first direction;

a second bank above the first bank, and comprising an edge bank defining an outermost boundary of the dummy area, covering an inner side of an edge bank pattern of the bank patterns that overlaps the edge bank, and covering an inner side of a portion of the first bank that overlaps the edge bank, the first bank and the second bank partitioning emission areas and dummy opening areas; and a light conversion layer in the emission areas and in the dummy opening areas, which correspond to openings of the second bank.

2. The display device of claim 1, wherein the second bank is spaced apart from the edge bank in the first direction, and overlaps the first bank.

3. The display device of claim 2, wherein an outer inclined surface of the edge bank is above the first bank, and has a tapered face, and wherein an inner inclined surface of the edge bank has a reverse tapered face.

4. The display device of claim 3, wherein an end of the outer inclined surface of the edge bank is above an end of the inner inclined surface of the edge bank.

5. The display device of claim 2, wherein a top surface of the edge bank is lower than a top surface of the second bank.

6. The display device of claim 2, wherein an edge bank area overlaps the edge bank, comprises a portion at which the via layer is removed, and covers a portion of a side of the via layer.

7. The display device of claim 6, further comprising:

alignment electrodes above the bank patterns and extending to the via layer; and a first insulating layer between the bank patterns and the first bank, and covering the alignment electrodes.

8. The display device of claim 7, wherein the edge bank contacts the first insulating layer.

9. The display device of claim 8, wherein the first insulating layer extends onto a passivation layer thereunder, which is exposed from the via layer.

10. The display device of claim 7, further comprising:

a second insulating layer between the first bank and the second bank, above the light-emitting elements, and exposing sides of the light-emitting elements; and a pixel electrode above the second insulating layer, and contacting the light-emitting elements.

11. The display device of claim 7, wherein a first dummy opening area contacting the edge bank, among the dummy opening areas comprises a passivation layer exposed at an area where part of the via layer is removed.

12. The display device of claim 1, wherein a width of a first dummy opening area contacting the edge bank in the first direction, among the dummy opening areas is greater than a width of an emission area of each of the pixels in the first direction.

13. The display device of claim 12, wherein a width in the first direction of the first dummy opening area is greater than a width in the first direction of a second dummy opening area among the dummy opening areas that is located inwardly of the first dummy opening area.

14. The display device of claim 12, wherein the light conversion layer in the first dummy opening area comprises color conversion particles comprised in pixels of different respective colors in the display area.

15. A display device comprising:

a substrate comprising a display area comprising pixels, and a dummy area adjacent to at least one side of the display area and comprising dummy pixels;

a pixel circuit layer comprising a transistor, and a via layer above the transistor;

bank patterns above the via layer;

light-emitting elements between the bank patterns in plan view; and a bank above a portion of the bank patterns, partitioning emission areas and dummy opening areas, and comprising an edge bank defining an outermost boundary of the dummy area, and having an outer inclined surface having a tapered face overlapping and above the bank pattern while having no reverse tapered face, and an inner inclined surface having a tapered face and a reverse tapered face.

16. A display device comprising:

a substrate comprising a display area comprising pixels, and a dummy area adjacent to at least one side of the display area and comprising dummy pixels;

a pixel circuit layer comprising a transistor, and a via layer above the transistor;

bank patterns above the via layer:

light-emitting elements between the bank patterns in plan view; and a bank above a portion of the bank patterns, partitioning emission areas and dummy opening areas, and comprising an edge bank defining an outermost boundary of the dummy area, having an outer inclined surface having a tapered face overlapping and above the bank pattern, and an inner inclined surface having a tapered face and a reverse tapered face, and covering an inner side of an edge bank pattern among the bank patterns that overlaps with the edge bank.

17. The display device of claim 15, wherein an end of the outer inclined surface of the edge bank is higher than an end of the inner inclined surface of the edge bank.

18. The display device of claim 15, wherein a top surface of the edge bank is lower than a top surface of another portion of the bank.

19. The display device of claim 15, wherein an edge bank area overlapping the edge bank comprises a portion at which the via layer is removed, and wherein the edge bank covers a portion of a side of the via layer.

20. The display device of claim 15, further comprising a light conversion layer filled in the emission areas and the dummy opening areas, which correspond to openings of the bank.

* * * * *